(12) United States Patent
Kim et al.

(10) Patent No.: US 6,437,714 B1
(45) Date of Patent: Aug. 20, 2002

(54) CHANNEL ENCODING DEVICE AND METHOD FOR COMMUNICATION SYSTEM

(75) Inventors: Jae-Yoel Kim, Kunpo; Chang-Soo Park; Hee-Won Kang, both of Seoul; Jun-Jin Kong; Jong-Seon No, both of Songnam; Kyeong-Cheol Yang, Seoul, all of (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/294,658

(22) Filed: Apr. 19, 1999

(30) Foreign Application Priority Data

Apr. 18, 1998 (KR) ............................................. 98-13956
Apr. 25, 1998 (KR) ............................................. 98-14879

(51) Int. Cl.⁷ ............................................... H03M 7/00
(52) U.S. Cl. ........................ 341/81; 714/790; 714/800; 341/55
(58) Field of Search .............................. 341/50, 55, 59, 341/81; 714/790, 800

(56) References Cited

U.S. PATENT DOCUMENTS

| | | | | |
|---|---|---|---|---|
| 4,771,400 A | * | 9/1988 | Omura et al. ................ 370/465 |
| 5,446,747 A | * | 8/1995 | Berrou ......................... 714/788 |
| 5,684,915 A | * | 11/1997 | Ueda et al. ..................... 386/68 |
| 5,721,745 A | * | 2/1998 | Hadlik et al. ................ 714/755 |
| 5,862,153 A | * | 1/1999 | Kikuchi et al. .............. 714/775 |
| 5,907,582 A | * | 5/1999 | Yi ............................... 375/259 |
| 5,978,365 A | * | 11/1999 | Yi ............................... 370/331 |
| 5,996,104 A | * | 11/1999 | Herzberg ..................... 714/755 |
| 2001/0009569 A1 | * | 7/2001 | Kang et al. .................. 375/242 |
| 2002/0021763 A1 | * | 2/2002 | Le Dantec ................... 375/295 |

FOREIGN PATENT DOCUMENTS

| | | | | |
|---|---|---|---|---|
| JP | 10-303801 | 11/1998 | ........... H04B/7/126 |
| JP | 11-508439 | 7/1999 | ........... H03M/13/12 |
| WO | WO97/40582 | 10/1997 | ........... H03M/13/00 |

* cited by examiner

*Primary Examiner*—Peguy JeanPierre
(74) *Attorney, Agent, or Firm*—Dilworth & Barrese, LLP

(57) ABSTRACT

A device and method for performing channel encoding using a frame structure having a termination effect in a recursive systemic encoder for a communication system. The channel encoding device having: an inserter for inserting at least one predefined bit in an input data bit stream at a predetermined position; and a channel encoder for encoding the bit-inserted data bit stream.

27 Claims, 31 Drawing Sheets

CHANNEL ENCODING DEVICE AND METHOD FOR COMMUNICATION SYSTEM

BACKGROUND OF THE INVENTION

1. Field of the Invention

The present invention relates generally to a device and method for communicating data in a unit of frame, and in particular, to a channel encoding device and method.

2. Description of the Related Art

In communication systems for processing voice, character, image and video signals, data is generally transmitted in consecutive frames. Further, in a system for communicating such frame data, a channel encoder for error correction should also encode data in the frame unit. In this case, the channel encoder inserts tail bit at the end of a data frame to reset the convolutional encoder to a known state and to allow the decoder to efficiently decode the frames using that information. An IS-95 system typically uses a non-recursive systemic convolutional encoder, which a sequence of zero(0) bits to the end of each frame by an amount equivalent to the number of taps of a serially time-delayed data sequence to implement the frame termination, because input bits are fed back to the delays.

FIG. 1 is a block diagram of a turbo encoder which is a typical recursive systemic encoder. The turbo encoder encodes an N-bits input frame into parity symbols using two simple constituent encoders, and can have a parallel or serial structure. In addition, the turbo encoder uses recursive systemic convolutional codes as constituent codes.

Shown in FIG. 1 is a conventional parallel turbo encoder, which is disclosed in U.S. Pat. No. 5,446,747 issued to Berrou, can be reference of this invention. The turbo encoder of FIG. 1 includes an interleaver 120 interposed between a first constituent encoder 110 and a second constituent encoder 130. The interleaver 120 has the same size as a frame length, N, of input data bits and changes arrangement of the data bits be input to the second constituent encoder 130 to reduce a correlation among the parity bits.

The first constituent encoder 110 encodes the input data bits and the interleaver 120 interleaves the input data bits according to a specified rule to change arrangement of the data bits. The second constituent encoder 130 encodes an output of the interleaver 120. The constituent encoder 110 and 130 are equal structures.

FIG. 2 is a diagram illustrating a termination scheme in the recursive systemic convolutional encoder of FIG. 1. For more detailed information, see D. Divsalar and F. Pollara, "On the Design of Turbo codes", TDA Progress Report 42–123, Nov. 15, 1995, also can be reference of this invention. Here, one frame data input to the first and second constituent encoders 110 and 130 is assumed to be 20-bit data. In FIG. 2, D1–D4 denotes delays and XOR1–XOR6 exclusive OR gates.

Referring to FIG. 2, for encoding, a switch SW1 is ON and a switch SW2 is OFF. Then, the 20-bit input frame data is applied in sequence to the delays D1–D4 and exclusively ORed by the exclusive gates XOR1–XOR6, thus outputting encoded bits at the XOR6. When the 20 data bits are all encoded in this manner, the switch SW1 is OFF and the switch SW2 is ON, for frame termination. Then, the XOR gates XOR1–XOR4 exclusively OR the output data bits of the delays and the corresponding fed-back data bits, respectively, thereby outputting zero bits. The resulting zero bits are again input to the delays D1–D4 in sequence and stored therein. These zero bits input to the delays D1–D4 become tail bits, and the tail bits also are encoded by the constituent encoder then output tail parity bits which are applied to a multiplexer.

The multiplexer multiplexes the encoded data bits and the tail parity bits output from the constituent encoder. The number of the generated tail bits depends on the number of the delays included in the constituent encoders 110 and 130. The termination scheme of FIG. 2 generates 4 tail bits per frame and the 4 encoded bits (tail parity bits) for the respective tail bits, undesirably increasing in the number of the final encoded bits, which leads to a decrease in a bit rate. That is, when the coding rate is defined as (the Number of Input Data Bits)/(the Number of Output Data Bits), a turbo code having the structure of FIG. 1 has a coding rate of (the Number of Input Data Bits)/{(the Number of first constituent encoder Encoded Data Bits+first tail bits+first tial parity bits)+(the Number of second constituent encoder Encoded Data Bits+second Tail parity bits)}. Accordingly, in FIG. 1, since the frame data is composed of 20 bits and the number of the delays is 4, the bit rate becomes 20/{(20)+(20+4+4)+(20+4+4)}.

Such a recursive systemic convolutional encoder has a performance depending upon the tailing method, because it is difficult to perfectly tail the turbo codes.

SUMMARY OF THE INVENTION

It is, therefore, an object of the present invention to provide a device and method for performing channel encoding using a frame structure having a termination effect in a recursive systemic encoder for a communication system.

It is another object of the present invention to provide a recursive systemic channel encoding device and method for inserting bits having a specific value in frame data at predefined positions before channel encoding, to attain a termination effect.

It is further another object of the present invention to provide a recursive systemic channel encoding device and method for inserting bits having a specific value at predefined positions of input frame data bits stream before channel encoding, channel encoding input data bits including the inserted bit, puncturing the inserted bits and encoded data bits exceeding a frame length at bit-inserted positions of the input frame data bits stream.

It is still further another object of the present invention to provide a channel encoding device and method for inserting bits having a specific value at predefined positions of frame data to encoding input data bits including the inserted bit, generating encoded symbol and tail parity using a recursive systemic constituent encoder, and puncturing inserted bits to insert the tail parity at the punctured inserted bits positions.

To achieve the above objects, there is provided a channel encoding device. In the channel encoding device, a bit inserter inserts bits having a specific value in data bits at bit positions having a higher error occurrence probability. A constituent encoder encodes an output of the bits inserter. A selector selects an output of the bit inserter and an output of the constituent encoder and outputs the selected value as channel encoded data.

BRIEF DESCRIPTION OF THE DRAWINGS

The above and other objects, features and advantages of the present invention will become more apparent from the following detailed description when taken in conjunction with the accompanying drawings in which like reference numerals indicate like parts. In the drawings.

DETAILED DESCRIPTION OF THE PREFERRED EMBODIMENT

Figure 1:
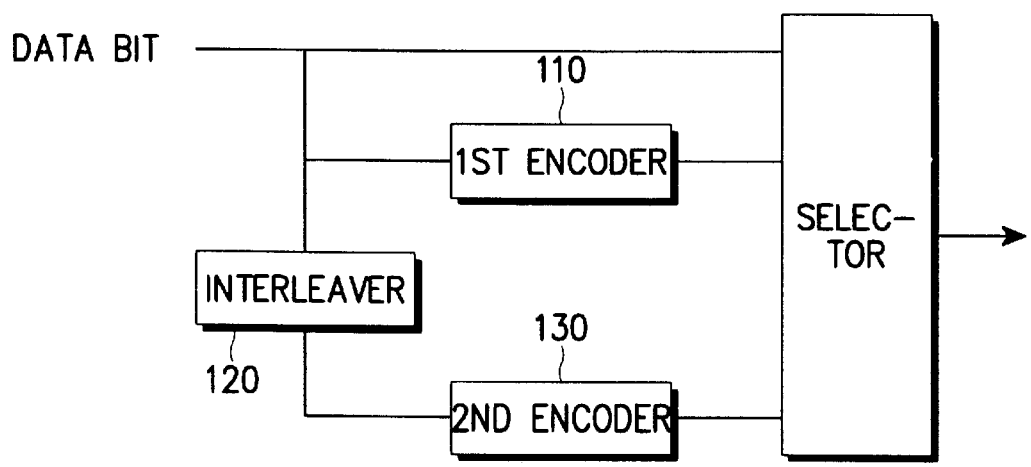
FIG. 1 is a diagram illustrating a conventional channel encoder for a communication system.
Figure 2:
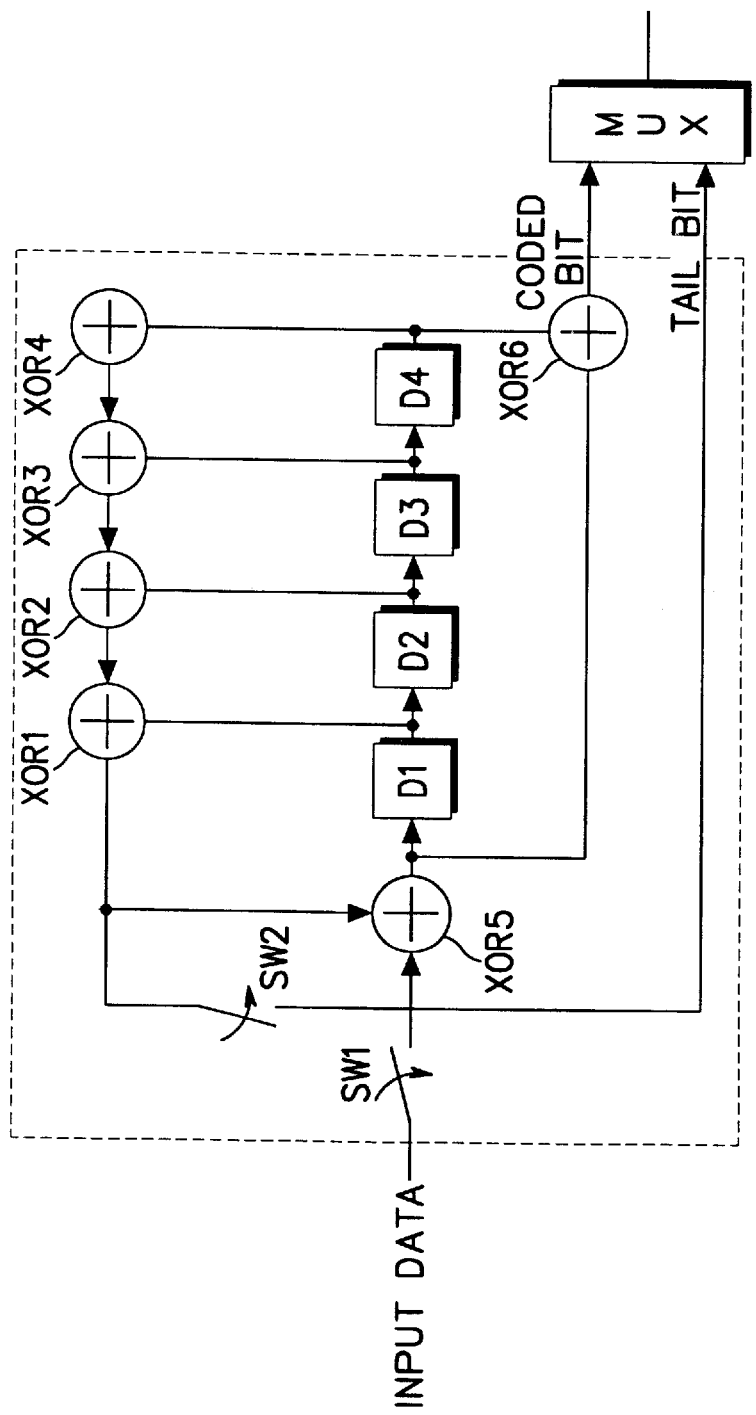
FIG. 2 is a diagram illustrating a constituent encoder (110 or 130) of FIG. 1.

A preferred embodiment of the present invention will be described hereinbelow with reference to the accompanying drawings. In the following description, well known functions or constructions are not described in detail since they would obscure the invention in unnecessary detail.

A term "data bit" used herein refers to data which is not encoded, and a term "parity bit" refers to data which is encoded by a constituent encoder. Generally, in a communication system, a transmitter encodes transmission data using a channel encoder and sends the encoded data; a receiver then demodulates the data received from the transmitter to convert the received data into the original data. Here, the channel encoder encodes the transmission data in the frame unit and generates tail bits, which are added to each frame of the transmission data to indicate a termination of the frame. The present invention proposes a frame structure having a termination effect in the channel encoder.

The frame structure having the termination effect can be implemented in several methods as follows:

First, known bits are inserted in one channel frame at the positions having a higher error occurrence probability, as many as the number of tail bits. Here, the recursive systemic constituent encoders may not have a structure for generating the tail bits. The error probability is determined by way of experiments, and the insert positions should be known to both the channel encoder and a channel decoder. The insert bit position could be known by transmit a relative message during call setup procedure or channel assignment procedure. The known bits to be inserted may be insignificant bits which rarely affect a communication performance, even though they are not transmitted. Also, they can be encoded bits or data bits predetermined with a receiver. Herein, they are assumed to be zero bits.

Second, the known bits are inserted in the channel frame at the positions having the higher error occurrence probability, as many as the number of tail bits, wherein the number of the known bits being inserted exceeds a predefined frame length. The bit-inserted data bits are encoded using the constituent encoders. Then, when outputting the channel encoded data, the bits exceeding the frame length of the channel encoded data are punctured at the bit-inserted positions of the input data. Here, the recursive systemic encoder does not generate the tail bits and the channel decoder should previously know the bit-inserted positions.

Third, the known bits are inserted in the channel frame at the positions having the higher error probability, as many as the number of the tail bits, in generating the channel encoded signal using the frame structure having the termination effect; the constituent encoder generates tail bits for termination and encoded data for the tail bits and thereafter, punctures the data bits at specific insert positions to insert the tail bits and the encoded data for the tail bits in the punctured bit insert positions.

Fourth, the tail bits are not generated, and the known bits are inserted in the channel frame at the positions having the higher error probability. In the bit insert positions, a plurality of encoded data bits are repeated transmitted instead of the inserted bits.

Fifth, for termination, bits having a specific logic are inserted in the data bits at the bit positions having the higher error probability. A constituent encoder encodes the bit-inserted data bits and generates tail bits, which are added to the encoded data bits. That is, the constituent encoder performs the termination function by bit inserting and tail bit adding.

Sixth, the same operation as the fifth method is performed. In addition, the inserted bits are punctured at the bit insert positions, and a first constituent encoder repeatedly transmits 4 tail parity bits at the punctured positions.

Seventh, the same operation as the sixth method is performed. In addition, the inserted bits are punctured at the bit insert positions, and a second constituent encoder repeatedly transmits the last 4 parity bits at the punctured positions.

Eighth, for termination, bits having a specific logic are inserted in the data bits at the bit positions having a higher error probability. A constituent encoder encodes the bit-inserted data bits and internally generates tail bits, which are added to the encoded data bits.

Ninth, for termination, 6 bits having a specific logic are inserted in the data bits at the bits positions having a higher error probability. A bit inserter punctures the inserted bits at the bit insert positions. A first constituent encoder performs tailing at the punctured positions and interleaves the tail bit-included data bits. When encoding an output of the first constituent encoder, a second constituent encoder inserts 6 bits exceeding the frame length in the punctured bit insert positions.

Now, reference will be made to nine different embodiments using the above bit inserting methods.

First Embodiment

An encoder according to a first embodiment of the present invention does not generate tail bits and instead, inserts known bits at predetermined positions to perform the termination function. In this embodiment, one frame has 16 data bits, and 8 known bits codes each being a zero bit are inserted in the frame at the bit positions having the higher error probability. Here, the bit insert positions are determined by experimentally detecting the positions where most errors occur while decoding the encoded data. Further, the turbo encoder uses a ⅓ coding rate.

In this embodiment, the positions having the higher error probability during decoding are experimentally determined, when the 24-bit frame data (of 16 frame data 10 bits plus the 8 known bits) is encoded using a turbo encoder having a ⅓ coding rate. Eight bit positions having the relatively higher error probability are determined, and at the determined positions, the known bits are inserted in the input frame data bits. Here, the decoder knows the bit-inserted positions, when decoding the encoded frame data in which the specific codes are inserted.

When the known bits are zero bits (in practice, the "0" bits are transmitted as "−1"), the zero bits at the insert positions are changed to a large negative value (e.g., −5) before decoding, in order to increase a reliability. In this manner, the decoder decodes the bits, knowing 8 bits which is ⅓ the 24 bits, thereby increasing the performance. In this case, the performance is increased, as the frame is shorter.

Figure 3:
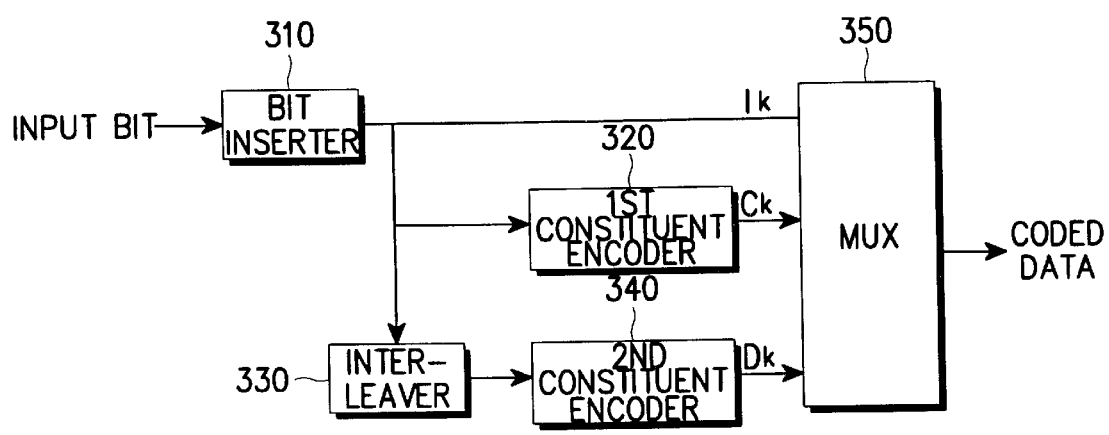
FIG. 3 is a diagram illustrating a channel encoder according to a first embodiment of the present invention.

FIG. 3 is a diagram illustrating a turbo encoder having a bit inserter for inserting the known bits according to the first embodiment of the present invention. A bit inserter 310 includes a bit generator for generating known bits by processing input data bits, and generates data bits in the frame unit by inserting the known bits generated by the bit generator at predefined bit insert positions. A first constituent encoder 320 encodes the data bits output from the bit inserter 310. An interleaver 330 interleaves the data bits in the frame unite, output from the bit inserter 310, according to a predetermined rule so as to change arrangement (or sequence) of the data bits. In the exemplary embodiment, a diagonal interleaver is used for the interleaver 330. A second constituent encoder 340 encodes the interleaved data bits in the frame unit, output from the interleaver 330. A recursive systemic convolutional encoders can be used for the first and second constituent encoders 320 and 340. A multiplexer 350 multiplexes outputs of the bit inserter 310, the first constituent encoder 320 and the second constituent encoder 340, under the control of a undepicted controller. Here, the bit inserter 310 outputs the data bits stream $I_k$, the first constituent encoder 320 the first parity bits $P1_k$ and the second constituent encoder 340 the second parity bits $P2_k$.

Figure 4:
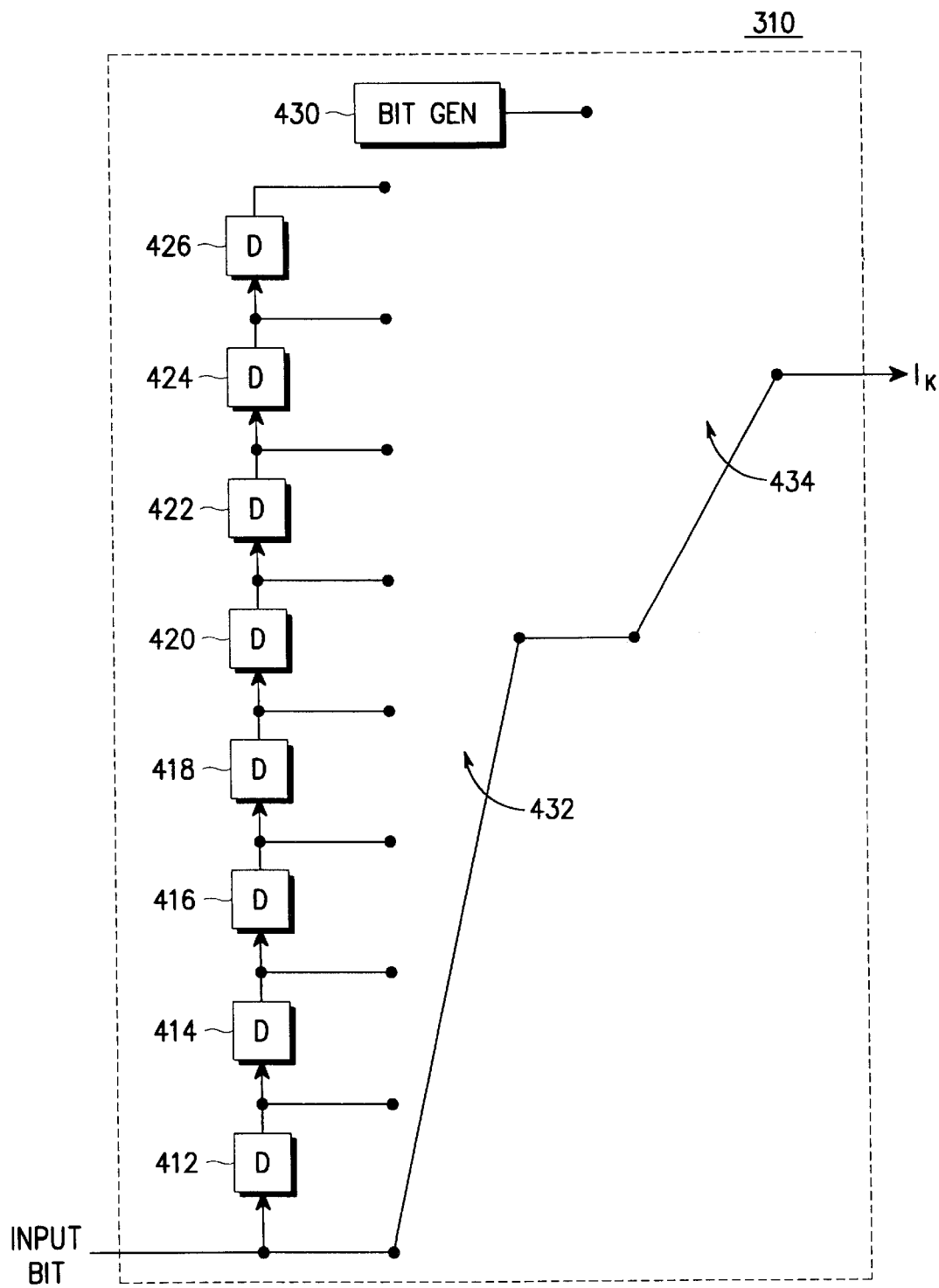
FIG. 4 is a detailed diagram illustrating a bit inserter (310) of FIG. 3.

FIG. 4 is a diagram illustrating the bit inserter 310 in the turbo encoder of FIG. 3. Referring to FIG. 4, a bit generator 430 generates known bits to be inserted in the data bits. Here, the known bits are assumed to be zero bits. Delays 412–426, which can be composed of memory elements such as flip-flops, may have a serial shift register structure for shifting input data bit according to a bit clock. A switch 432 is switched to select the outputs of the delays 412–426, under the control of the undepicted controller. Also, the switch 432 is switched to an output of a next delay at the positions where a known bit output from the bit generator 430 is inserted in the data bits, under the control of the undepicted controller. That is, the switch 432 selects a data bit being delayed by one bit, when the selected known bit is inserted in the data bits. The switch 432 can be implemented by a multiplexer. A switch 434 is switched to outputs of the bit generator 430 and the switch 432 to generate data bits $I_k$, under the control of the undepicted controller. The switch 434 inserts the known bits in the input data bits at the predefined positions under the control of the controller.

A description will be made as to operation of inserting the known bits in the data bits with reference to FIG. 4. The input data bits are delayed by the delays 412–426 according to the bit clock. Initially, the switch 432 selects the input data bits and the switch 434 is connected to the switch 432. Then, the input data bits are output via the switches 432 and 434. In the meantime, if the bit insert position is determined, the switch 432 is connected to the output of the delay 412 and the switch 434 is connected to the output of the bit generator 430, under the control of the controller. As a result, a path for the data bits is cut off and the zero bit output from the bit generator 430 is inserted in the corresponding bit position.

In the case where the data bits should be continuously output after insertion of the zero bit, the switch 434 is connected again to the switch 432 by the controller. That is, since the one bit-delayed data bit is selected after insertion of the zero bit, the zero bit can be inserted at the predefined position without loss of the data bit.

The zero bits are inserted in the data bits for one frame by repeating this process. Upon reception of data bits for the next frame after insertion of the zero bits, the switch 432 is connected to a data bit input node and then, the above process is repeated again. In the case where the data bits are encoded for communication, an error probability is relatively higher at the rear portion of the data bit stream input to the respective constituent encoders. Accordingly, the positions where the zero bits output from the bit generator 430 are inserted, can be mostly located at the rear portion of the data bit stream as shown in Table 1, by way of example.

TABLE 1

| I1 I2 I3 I4 I5 I6 I7 I8 I9 I10 I11 Ib1 I12 I13 I14 Ib2 I15 I16 Ib3 Ib4 Ib5 Ib6 Ib7 Ib8 |
|---| where Ix denotes data bits and Ibx inserted bits.

The reason for inserting the known bits in the data bit stream is to improve a decoding performance at the receiver. Therefore, it is preferable to insert the known bits at the bit positions in the channel frame, having the higher error occurrence probability, as many as the number of tail bits. In most cases, the bit positions having the higher error occurrence probability are distributed at the rear portion of the data bit stream input to the constituent encoders, as shown in Table 1. Accordingly, the known bits are inserted at the rear portion of the data bit streams which are input to the first and second constituent encoders 320 and 340. Here, for the second constituent encoder 340, the known bits should be inserted at the rear portion of the interleaved data bits output from the interleaver 330. Accordingly, the bit inserter 310 should take this into consideration in inserting the known bits in the data bits applied to the second constituent encoder 340.

Figure 5:
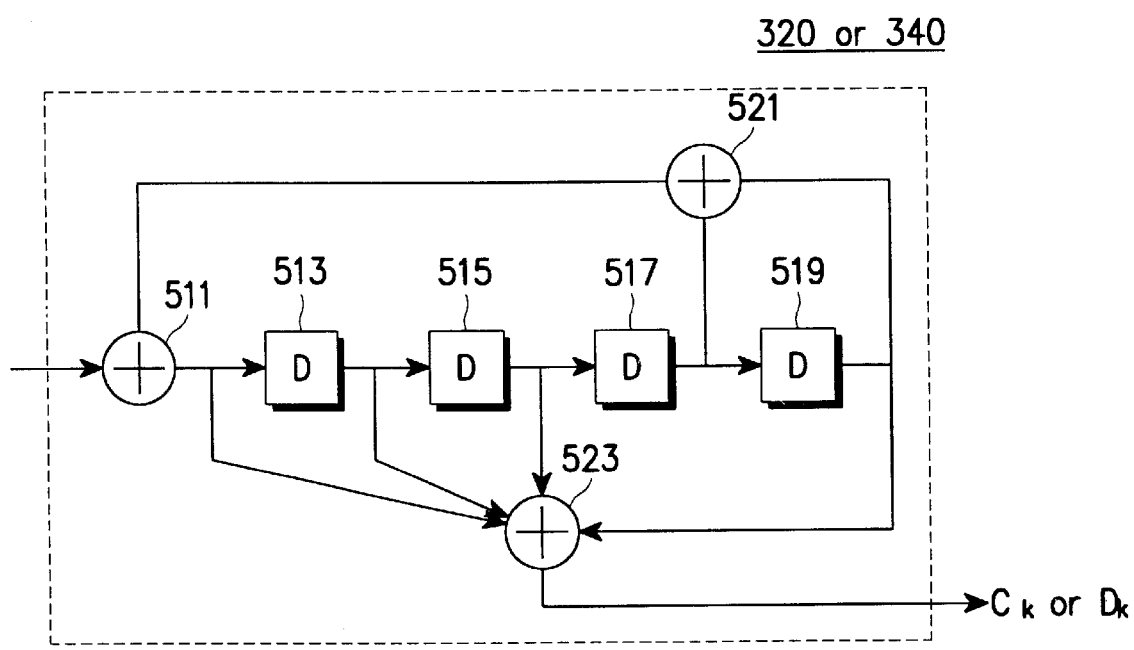
FIG. 5 is a detailed diagram illustrating a constituent encoder (320 or 340) of FIG. 3.

The data bits of Table 1, output from the bit inserter 310, are applied to the first constituent encoder 320 and the interleaver 330. The interleaved data bits in the frame unit, output from the interleaver 330, are encoded by the second constituent encoder 340. FIG. 5 illustrates a structure of the first and second constituent encoders 320 and 340 of FIG. 3. As illustrated, the first and second constituent encoders 320 and 340 are recursive systemic convolutional encoders. In addition, the constituent encoders 320 and 340 have the structure which does not generate the tail bits, as shown in FIG. 5.

The first constituent encoder 320 encodes the data bits of Table 1, output from the bit inserter 310. The encoded data bits output from the first constituent encoder 320 are shown in Table 2.

TABLE 2

| C1 C2 C3 C4 C5 C6 C7 C8 C9 C10 C11 Cb1 C12 C13 C14 Cb2 C15 C16 Cb3 Cb4 Cb5 Cb6 Cb7 Cb8 |
|---| where Cx denotes symbols output from the first constituent encoder 320, and Cbx denotes symbols of the inserted bits, output from the first constituent encoder 320. Here, in the case where the turbo encoder 320 has the ⅓ coding rate.

In the meantime, the interleaver 330 interleaves the data bits output from the bit inserter 310 and the second constituent encoder 340 encodes the interleaved data bits output from the interleaver 330. The encoded data bits output from the second constituent encoder 340 are shown in Table 3.

TABLE 3

| D1 D2 D3 D4 D5 D6 D7 D8 D9 D10 D11 Db1 D12 D13 D14 Db2 D15 D16 Db3 Db4 Db5 Db6 Db7 Db8 |
|---| where Dx denotes symbols output from the second constituent encoder 340 and Dbx symbols of the inserted bits, output from the second constituent encoder 340. Here, in the case where the turbo encoder 340 has the ⅓ coding rate. Although the sequence of the data bits was actually rearranged by interleaving, the sequence remains unchanged in Table 3, for the convenience of explanation.

The multiplexer 350 then multiplexes the outputs of the bit inserter 310, the first constituent encoder 320 and the second constituent encoder 340, under the control of the undepicted controller. Shown in Table 4 are the channel encoded data bits output from the multiplexer 350.

TABLE 4

| I1 I2 I3 I4 I5 I6 I7 I8 I9 I10 I11 Ib1 I12 I13 I14 Ib2 I15 I16 Ib3 Ib4 Ib5 Ib6 Ib7 Ib8 |
|---|
| C1 C2 C3 C4 C5 C6 C7 C8 C9 C10 C11 Cb1 C12 C13 C14 Cb2 C15 C16 Cb3 Cb4 Cb5 Cb6 Cb7 Cb8 |
| D1 D2 D3 D4 D5 D6 D7 D8 D9 D10 D11 Db1 D12 D13 D14 Db2 D15 D16 Db3 Db4 Db5 Db6 Db7 Db8 |

A performance of the channel encoder can be varied according to the insert positions of the known bits. For example, it is possible to improve the performance of the channel encoder by inserting the known bits in the input data bit stream at regular intervals, as shown in Table 5.

TABLE 5

| I1 I2 I3 I4 Ib1 Ib2 I5 I6 I7 I8 Ib3 Ib4 I9 I10 I11 I12 Ib5 Ib6 I13 I14 I15 I16 Ib7 Ib8 |
|---| where Ix denotes data bits and Ibx inserted bits.

Accordingly, as shown in Table 5, it is preferable to continuously insert the known bits in the input data bit stream at regular intervals, as many as the number of the memories in the constituent encoder (e.g., for a constraint length of 3, two known bits are continuously inserted).

Figure 6:
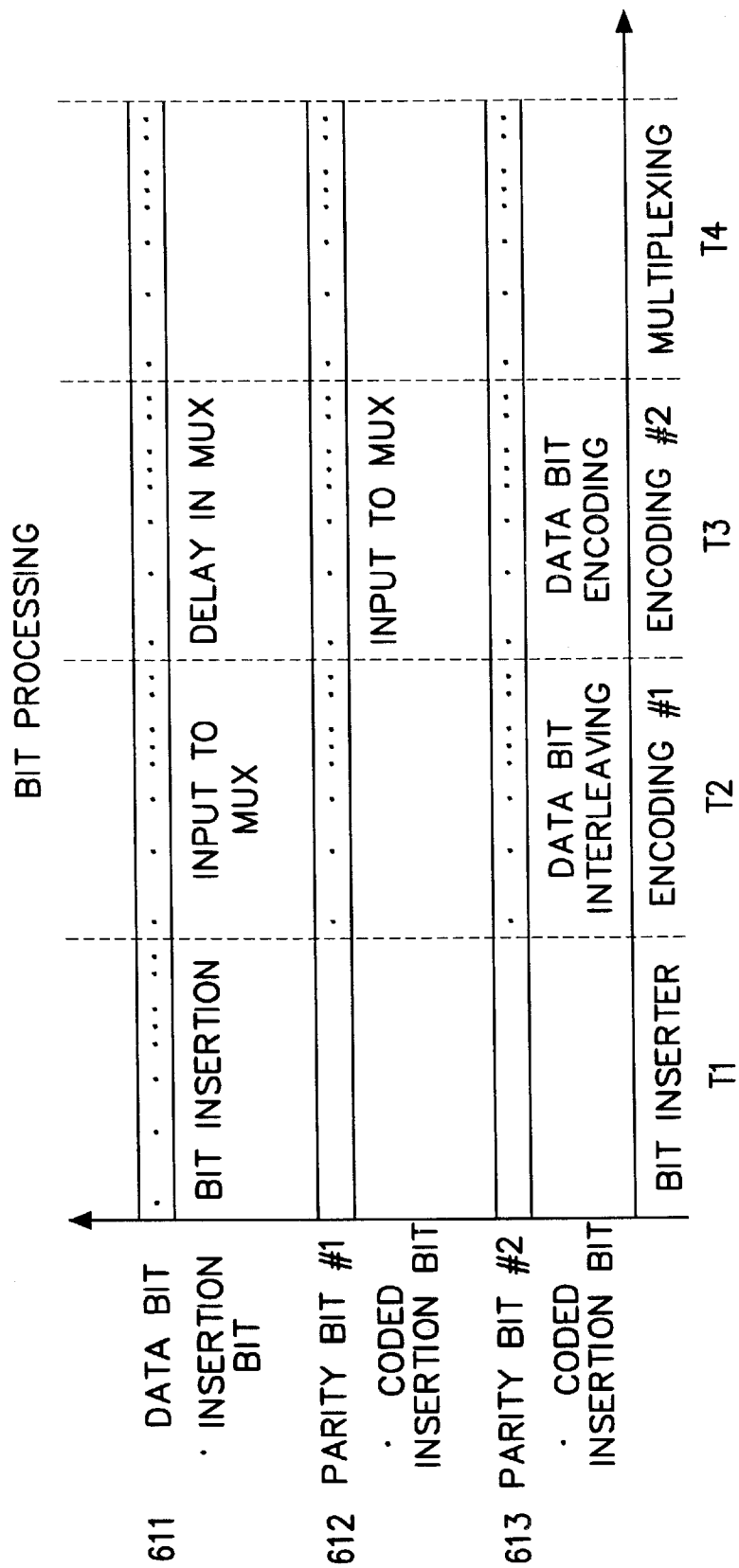
FIG. 6 is a diagram for explaining a bit processing procedure with the passage of time according to the first embodiment.

FIG. 6 is a timing diagram of the turbo encoder of FIG. 3 according to the first embodiment of the present invention. Referring to FIG. 6, in an interval T1, the bit inserter 310 inserts the zero bits in the frame at the predefined bit positions to generate the data bits $I_k$ of Table 1 (see 611). In an interval T2, the zero bit-inserted data bits $I_k$ are simultaneously applied to the multiplexer 350, the first constituent encoder 320 and the interleaver 330. Then, the first constituent encoder 320 encodes the zero bit-inserted data bits $I_k$ to generate first encoded data bits $C_k$ which are the first parity bits (see 612), and the interleaver 330 interleaves the zero bit-inserted data bits $I_k$ according to the predefined rule (see 613). Thereafter, in an interval T3, the multiplexer 350 delays the data bits $I_k$ output from the bit inserter 310 by one frame period, the first constituent encoder 320 inputs the first encoded data bits $C_k$ to the multiplexer 350 and the second constituent encoder 340 encodes the interleaved data bits $I_k$ output from the interleaver 330 to generate second encoded data bits $D_k$ which are the second parity bits. Upon the instant that the second constituent encoder 340 generates the second parity bits $D_k$, the multiplexer 350 multiplexes the data bits $I_k$, the first parity bits $C_k$ and the second parity bits $D_k$, in an interval T4.

Although FIG. 6 shows an example of parallel processing the data bits $I_k$, the first parity bits $C_k$ and the second parity bits $D_k$, it is also possible to serially output the outputs of the bit inserter 310, the first constituent encoder 320 and the second constituent encoder 340 in the order of bit generation.

As can be appreciated from the foregoing descriptions, in the recursive systemic turbo encoder according to the first embodiment, the respective constituent encoders do not generate the tail bits for termination and instead, insert the known bits (i.e., zero bits) at the bit positions having the higher error probability.

Second Embodiment

A channel encoder according to a second embodiment of the present invention inserts known bits at the bit positions having the higher error occurrence probability, wherein the number of the inserted bits is set to exceed the frame size (or length). In this exemplary embodiment, each frame is assumed to include 16 input data bits and 12 inserted bits. Since the output data bits $I_k$, parity bits $C_k$ and $D_k$ should be 28 bits. The inserted bits are deleted and the surplus parity bits $C_k$ and $D_k$ are inserted in the position of the deleted bits.

The number of the insert bits is determined by the input data bit number of the encoder, the number of the output code symbols and a code rate. That is, when the input data bit number of the encoder is N, the number of output code symbols of the encoder is M and the code rate is 1/K, the number of insert bits is (M−KN)/(K−1). From this, when the input data bit number of the encoder is 16, the number of output code symbols is 72 and the code rate is ⅓, the number of insert bits is 12.

Actually, as the number of the insert bits increases, the encoder has the increased performance. The encoder according to this embodiment can maximally improve its performance by inserting the known bits as many as possible, with the given input data bit number and output code symbol number. In this embodiment, when 12 insert bits are used and the data bits are transmitted after encoding, it is possible to improve the performance of the encoder by transmitting only the encoded symbols, without transmitting the inserted bits, for maximal bit inserting.

Figure 7:
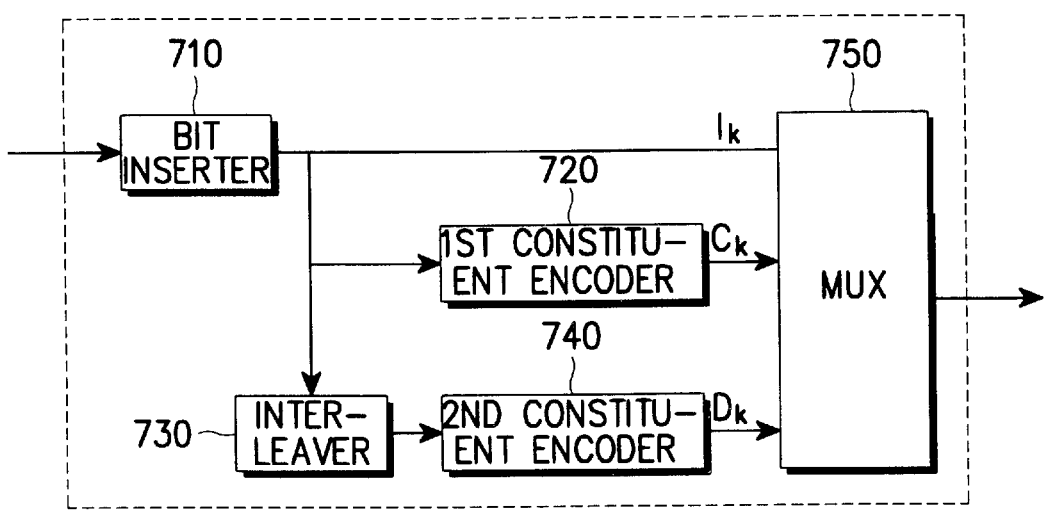
FIG. 7 is a diagram illustrating a channel encoder according to a second embodiment of the present invention.

FIG. 7 is a diagram illustrating the channel encoder according to the second embodiment of the present invention. A bit inserter 710 includes a bit generator for generating known bits by processing input data bits, and generates data bits exceeding the frame size by inserting the known bits generated by the bit generator at predefined bit positions. A first constituent encoder 720 encodes the data bits output from the bit inserter 710 to generate first parity bits $C_k$. An interleaver 730 interleaves the data bits in the frame unite, output from the bit inserter 710, according to a predetermined rule so as to change arrangement (or sequence) of the data bits. In the exemplary embodiment, a diagonal interleaver is used for the interleaver 730. A second constituent encoder 740 encodes the interleaved data bits in the frame unit, output from the interleaver 730, to generate second parity bits $D_k$. A recursive systemic convolutional encoder can be used for the first and second constituent encoders 720 and 740. A multiplexer 750 multiplexes outputs of the bit inserter 710, the first constituent encoder 720 and the second constituent encoder 740 to generate a data frame of a predefined length, under the control of a undepicted controller. Here, the bit inserter 710 outputs the data bits $I_k$, the first constituent encoder 720 the first parity bits $P1_k$ and the second constituent encoder 740 the second parity bits $P2_k$.

In operation, upon receipt of the 16 input data bits, the bit inserter 710 operates in the same manner as the bit inserter 310 of the first embodiment. The bit inserter 710 has a structure similar to that of FIG. 4 except that it is composed of 12 delays. Therefore, the bit inserter 710 inserts 12 zero bits in the frame at 12 bit positions having the higher error probability by controlling the internal switches under the control of the controller. Accordingly, in this embodiment, the bit inserter 710 outputs the 28 data bits $I_k$, which are simultaneously applied to the multiplexer 750, the first constituent encoder 720 and the interleaver 730. Further, the interleaved data bits $I_k$ output from the interleaver 730 are applied to the second constituent encoder 740. Here, the first and second constituent encoders 720 and 740 have the structure of FIG. 5, which does not generate the tail bits for termination.

he first constituent encoder 720 then encodes the 28 data bits $I_k$ with the 12 zero bits inserted therein, output from the bit inserter 710, and outputs 28 first parity bits $C_k$ to the multiplexer 750. The interleaver 730 interleaves the 28 data bits $I_k$ output from the bit inserter 710, and the second constituent encoder 740 encodes the interleaved data bits in the same manner as the first constituent encoder 720 to generate 28 second parity bits $D_k$, which are applied to the multiplexer 750.

The multiplexer 750 punctures the inserted bits from data bits $I_k$ to insert the six first parity bits $C_k$ and the six second parity bits $D_k$ in the punctured positions and then, outputs the remaining 22 first parity bits $C_k$ and the remaining 22 second parity bits $D_k$.

Figure 8:
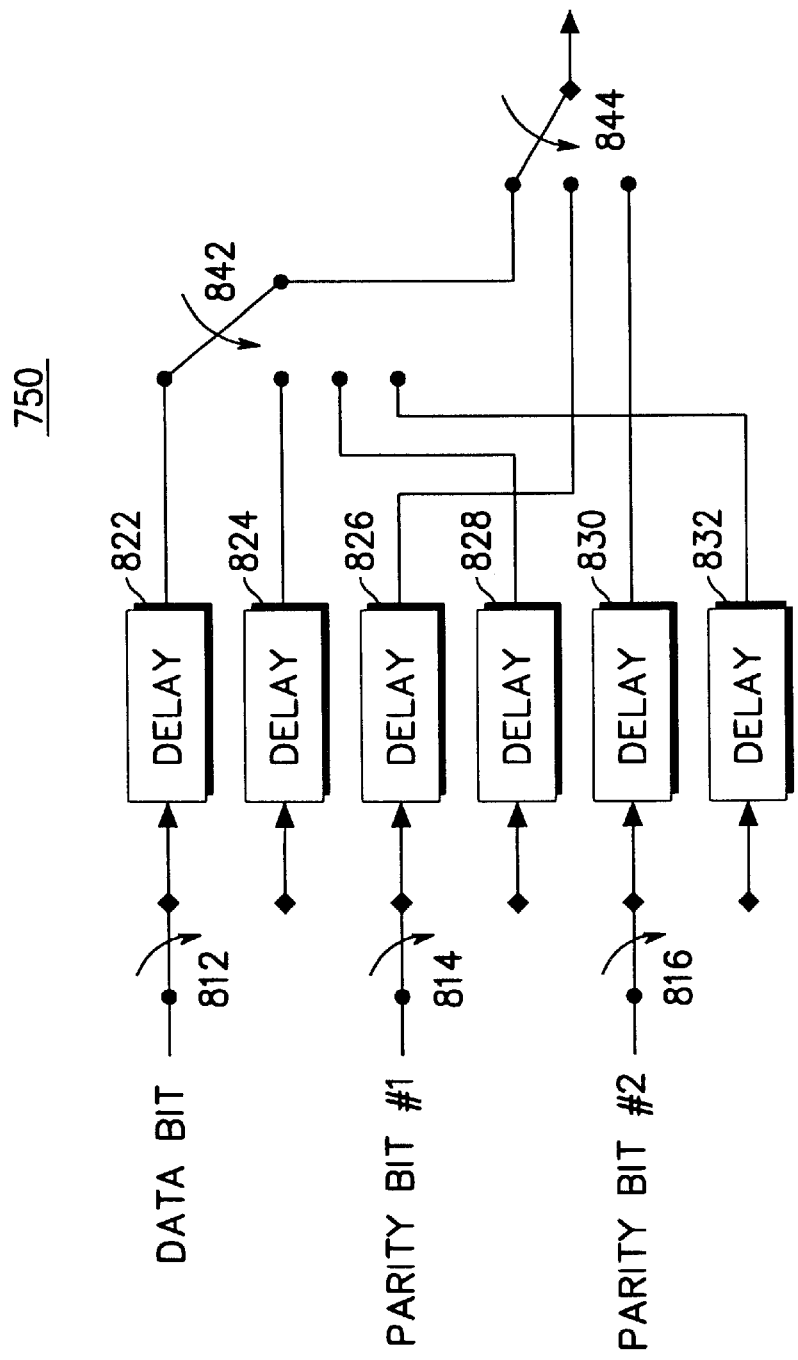
FIG. 8 is a detailed diagram illustrating a multiplexer (750) of FIG. 7.

Referring to FIG. 8, the multiplexer 750 first receives the 28 data bits $I_k$ output from the bit inserter 710. Then, a switch 812 in the multiplexer 750 is connected to a delay 822 until the first 22 data bits out of the 28 data bits $I_k$ are received from the bit inserter 710, and the delay 822 delays the received data bits $I_k$. Thereafter, the switch 812 is connected to a delay 824 until the remaining 4 data bits out of the 28 data bits $I_k$ are received from the bit inserter 710, and the delay 824 delays the received remaining 6 data bits.

In the same manner, the multiplexer 750 receives the 28 first parity bits $C_k$ output from the first constituent encoder 720. Then, a switch 814 in the multiplexer 750 is connected to a delay 826 until the first 22 data bits out of the 28 first parity bits $C_k$ are received from the first constituent encoder 720, and the delay 826 delays the received first parity bits $C_k$. Thereafter, the switch 814 is connected to a delay 828 until the remaining 6 first parity bits out of the 28 first parity bits $C_k$ are received from the first constituent encoder 720, and the delay 828 delays the received remaining 6 first parity bits.

Thereafter, the multiplexer 750 receives the 28 second parity bits $D_k$ output from the second constituent encoder 740. Then, a switch 816 in the multiplexer 750 is connected to a delay 830 until the first 22 data bits out of the 28 second parity bits $D_k$ are received from the second constituent encoder 740, and the delay 830 delays the received second parity bits $D_k$. Thereafter, the switch 816 is connected to a delay 832 until the remaining 6 second parity bits out of the 28 second parity bits $D_k$ are received from the second constituent encoder 740, and the delay 832 delays the received remaining 6 second parity bits.

As described above, the multiplexer 750 sequentially receives the 28 data bits $I_k$, the 28 first parity bits $C_k$ and the 28 second parity bits $D_k$, and separately stores the first 22 bits and the remaining 6 bits out of the respective bits in the corresponding delays. The switches 812–816 are controlled by the undepicted controller. Further, the delays 822–832 each are composed of cascaded memory elements and store the input bits until the corresponding delay process is completed.

Upon completion of the delay process, the switch 844 is connected to a switch 842 and the switch 842 is connected to the delay 822. Therefore, an output of the delay 822 is output via the switches 842 and 844. When one data bit stored in the delay 822 is output, the switch 842 is connected to the delay 824, maintaining connection with the switch 844. Then, one of the remaining data bits stored in the delay 824 is output via the switches 842 and 844. That is, the data bit stored in the delay 822 is punctured and then, the data bit stored in the delay 824 is output. Thereafter, the switch 842 is connected to the delay 822, continuously maintaining connection with the switch 844. By repeating the above process 6 times, the data bits stored in the delay 822 are punctured and then, the remaining six data bits stored in the delay 824 are inserted in the punctured positions.

Subsequently, the switch 842 is connected to the delay 822, maintaining connection with the switch 844. Then, the output of the delay 822 is output via the switches 842 and 844. When one data bit stored in the delay 822 is output, the switch 842 is connected to the delay 828, maintaining connection with the switch 844. Then, one of the remaining six first parity bits stored in the delay 828 is output via the switches 842 and 844. Thereafter, the switch 842 is connected again to the delay 822, continuously maintaining connection with the switch 844. By repeating the above process 6 times, the data bits stored in the delay 822 are punctured and then, the remaining six first parity bits stored in the delay 828 are inserted in the punctured positions.

In this manner, the data bits and the remaining six first parity bits are alternately output. Next, the switch 842 is connected to the delay 822, maintaining connection with the switch 844. Then, the output of the delay 822 is output via the switches 842 and 844. When one data bit stored in the delay 822 is output, the switch 842 is connected to the delay 832, maintaining connection with the switch 844. Then, one of the remaining six second parity bits stored in the delay 832 is output via the switches 842 and 844. Thereafter, the switch 842 is connected again to the delay 822, continuously maintaining connection with the switch 844. By repeating the above process 6 times, the data bits stored in the delay 822 are punctured and then, the remaining six second parity bits stored in the delay 832 are inserted in the punctured positions.

By way of the foregoing procedure, the 22 data bits stored in the delay 822 are punctured and then, the remaining 6 data bits stored in the delay 824, the remaining 6 first parity bits stored in the delay 828 and the remaining 6 second parity bits stored in the delay 832 are inserted in the punctured positions. Accordingly, the multiplexer 750 punctures the inserted bits from the data bits $I_k$ output from the bit inserter 710 and inserts the 8 parity bits in the punctured insert positions, thereby outputting 24 data bits.

Upon completion of the above process, the switch 844 is connected to the delay 826. Then, the 22 first parity bits $C_k$ stored in the delay 826 are output. Thereafter, the switch 844 is connected to the delay 830 to output the 22 second parity bits $D_k$ stored in the delay 830.

Figure 9:
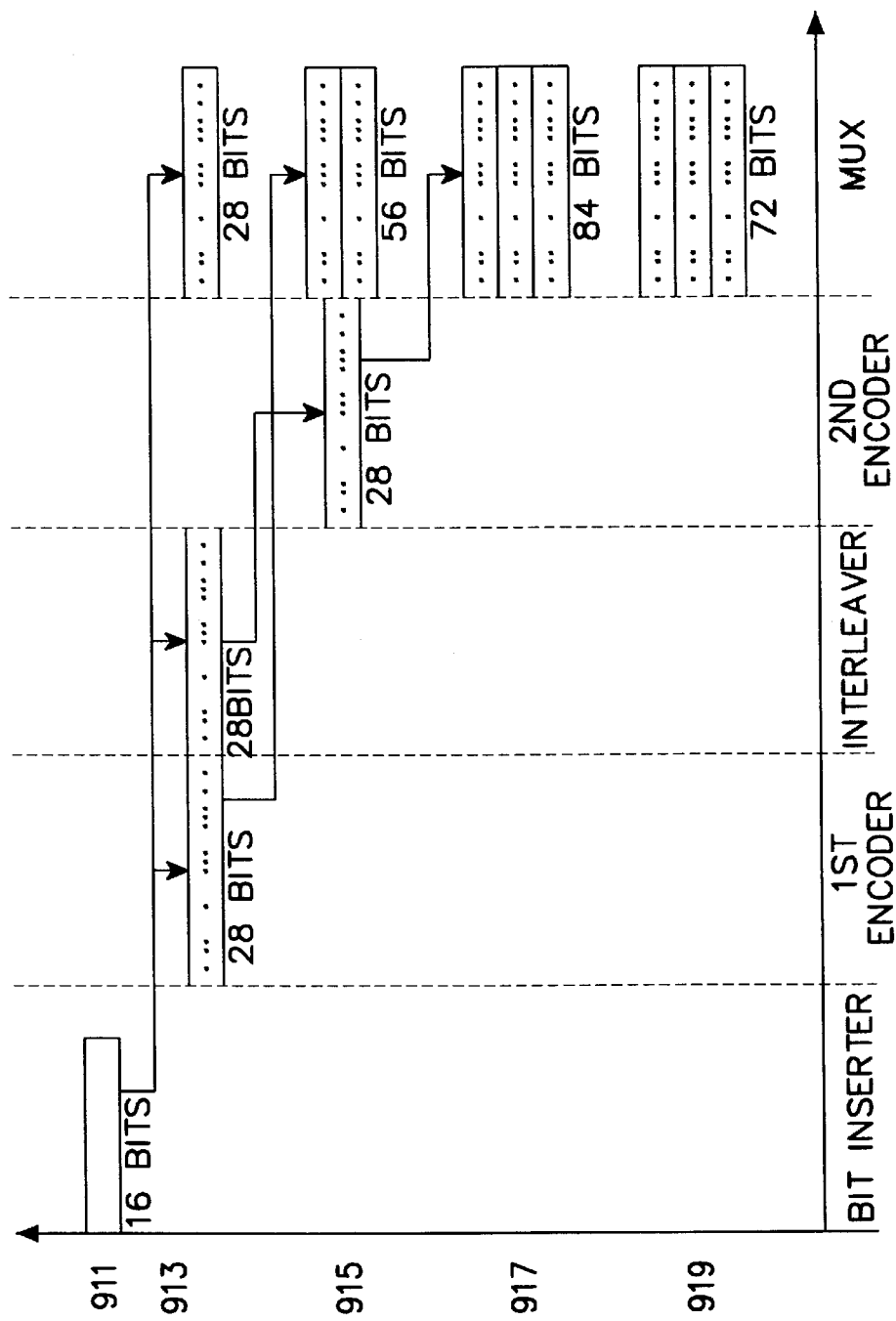
FIG. 9 is a diagram for explaining a bit processing procedure with the passage of time according to the second embodiment.

Referring to FIG. 9, in the encoder of FIG. 7 according to the second embodiment, the bit inserter 710 inserts 12 bits in the 16 input data bits to generate the 28 data bits $I_k$. Thus, the first and second constituent encoders 720 and 740 generate the 28 first parity bits $C_k$ and the 28 second parity bits $D_k$, respectively. The multiplexer 750 punctures the 28 data bits $I_k$ at 12 insert positions and then, inserts therein the remaining 6 data bits, the remaining 6 first parity bits and the remaining 6 second parity bits. Thereafter, the multiplexer 750 sequentially outputs the data bits $I_k$, the first parity bits $C_k$ and the second parity bits $D_k$.

In the decoding process, the output values of the multiplexer 750 are demultiplexed into a data bit portion, a first parity bit portion and a second parity bit portion, wherein the data bit portion is punctured with a value of "−5" at the bit inserting portion. Such processed data bits are decoded by an existing decoder. (See Claude Berrou, Alain Glavieux and Punya Thitmajshima "Near Shannon Limit Error-Correction Coding and Decoding: Turbo-Codes (1)".)

Third Embodiment

An encoder according to a third embodiment of the present invention inserts bits having a specific logic in the data bits at the bit positions having the higher error occurrence probability, wherein the constituent encoders encode the known bit-inserted data bits and generate tail bits to be added to encoded data bits. That is, the encoder according to the third embodiment performs the termination function by bit inserting and tail bit adding.

Figure 10:
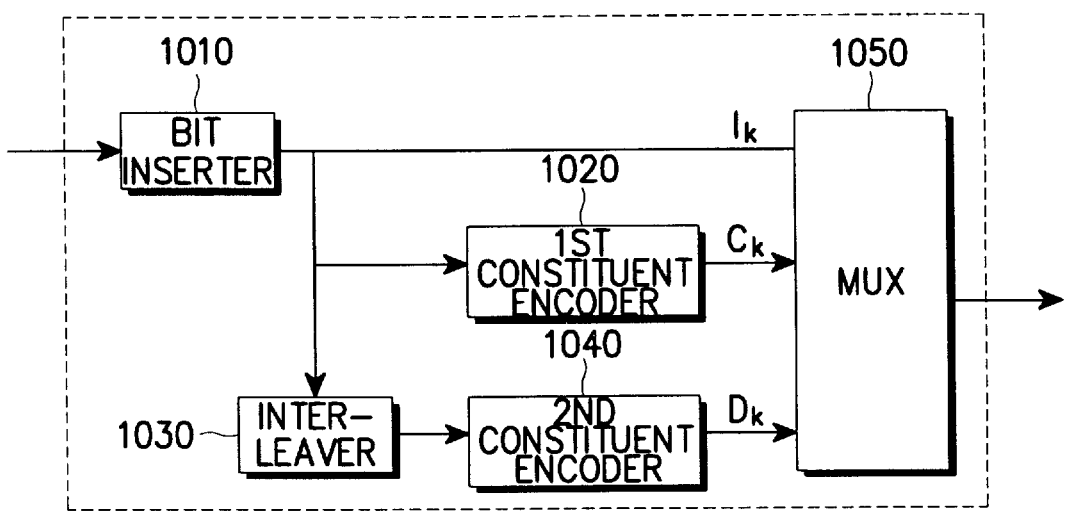
FIG. 10 is a diagram illustrating a channel encoder according to a third embodiment of the present invention.

FIG. 10 is a diagram illustrating the encoder according to the third embodiment of the present invention. Referring to FIG. 10, a bit inserter 1010 receives 16 input bits and has the same structure as the bit inserter 310 according to the first embodiment. The bit inserter 1010 inserts 8 zero bits in a frame at 8 data bit positions having the higher error probability, under the control of a undepicted controller. Accordingly, in this exemplary embodiment, the bit inserter 1010 outputs 24 data bits $I_k$, which are applied in common to a multiplexer 1050, a first constituent encoder 1020 and an interleaver 1030. Further, the interleaved data bits $I_k$ output from the interleaver 1030 are applied to a second constituent encoder 1040. The first constituent encoder 1020 is a recursive systemic constituent encoder shown in FIG. 111, having a structure for generating the tail bits to be added to the encoded data bits. In addition, the second constituent encoder 1040 has a structure which does not generate the tail bits for termination, as that in FIG. 5 of the first embodiment.

Figure 11:
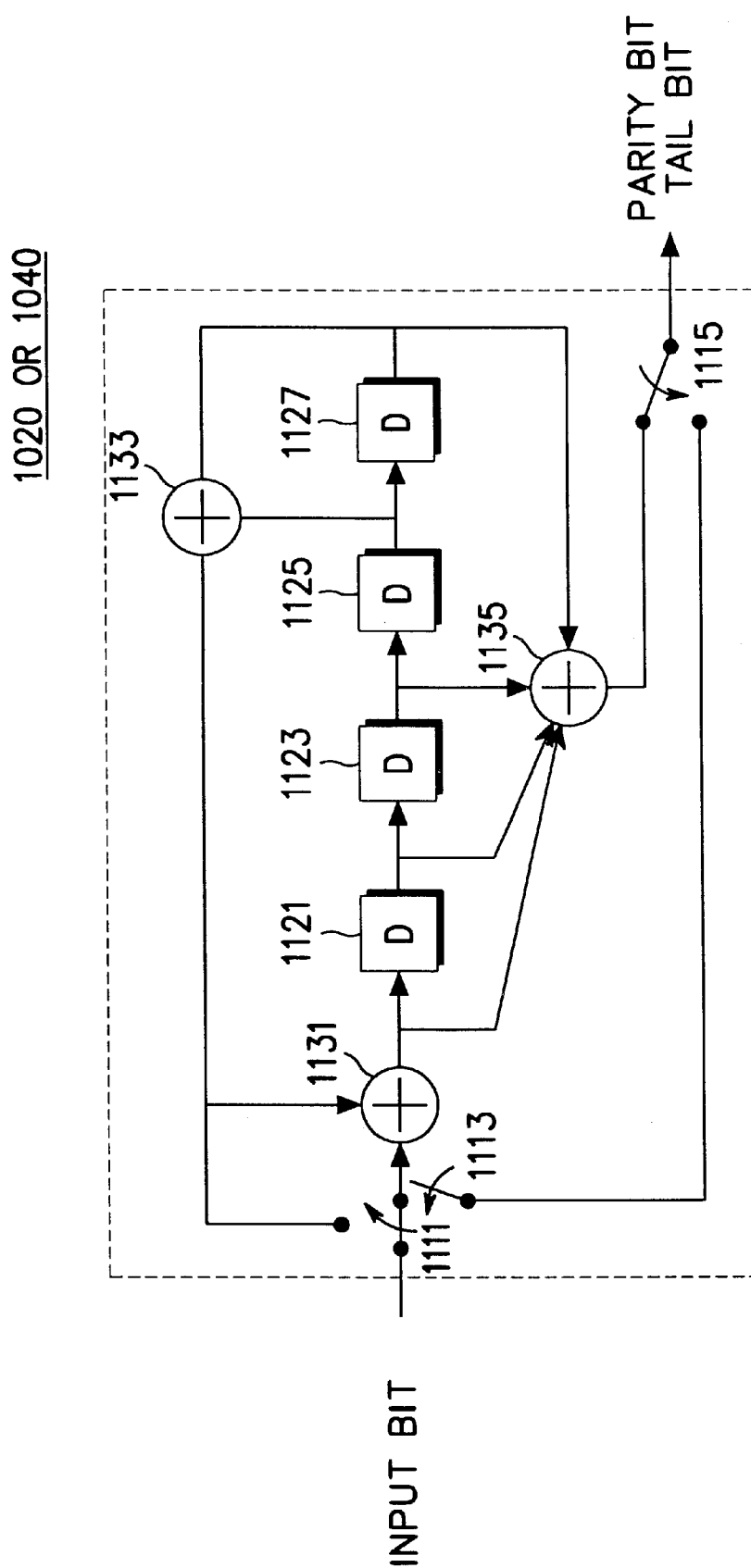
FIG. 11 is a detailed diagram illustrating a constituent encoder (1020 or 1040) of FIG. 10.

Referring to FIG. 11, operation of the first constituent encoder 1020 will be described. For encoding, a switch 1111 connects an input node to an exclusive OR gate 1131, a switch 1113 maintains an OFF state, and a switch 1115 is connected to an exclusive OR gate 1135. Then, the 24 data bits $I_k$ are sequentially applied to delays 1121–1127 via the switch 1111 and the exclusive OR gate 1131, and the exclusive OR gate 1135 outputs encoded data bits. When the data bits $I_k$ are all encoded by the delays 1121–1127 and the exclusive OR gate 1135 in this manner, the switch 1111 is connected to exclusive OR gates 1133 and 1131, the switch 1113 is ON, and the switch 1115 is connected to the switch 1113. Then, zero bits are generated by exclusive ORing the outputs being fed back, stored in the delays 1121–1127 and output via the switch 1115. Here, the zero values stored in the delays 1121–1127 become the tail bits and are output through the switch 1115. The number of the tail bits corresponds to the number of the delays in the constituent encoder 1020. In FIG. 11, the first constituent encoder 1020 generates 4 tail bits per frame and also generates encoded bits for the respective tail bits paritie. Therefore, the first component code outputs 24 bits first parities, 4 tail bits and 4 tail parities.

Accordingly, the first constituent encoder 1020 generates 24 first parity bits $C_k$ and, upon processing the last data bit (i.e., the $24^{th}$ data bit), connects the switch 1111 to the exclusive OR gate 1133, the switch 1113 to the switch 1111 and the switch 1115 to the switch 1113; the same process is repeated four times to generate 4 tail bits. Through this procedure, the 28 first parity bits $C_k$ and the 4 tail bits are output to the multiplexer 1050.

In addition, the interleaver 1030 interleaves the 24 data bits $I_k$ output from the bit inserter 1010 and provides the interleaved data bits to the second constituent encoder 1040. The second constituent encoder 1040 then encodes the interleaved data bits in the same manner as the first constituent encoder 1020 to generate 24 second parity bits $D_k$, which are applied to the multiplexer 1050.

The interleaved data bits in the frame unit, output from the interleaver 1030, are encoded by the second constituent encoder 1040 which has the same structure as that shown in FIG. 5. The second constituent encoder 1040 is a recursive systemic convolutional encoder, as shown in FIG. 5. In addition, the second constituent encoder 1040 has a structure which does not generate the tail bits.

The multiplexer 1050 then punctures the inserted bits from data bits $I_k$, and inserts the 4 first parity bits $C_k$ in the punctured positions, and selectively outputs the remaining 24 first parity bits $C_k$ and the 24 second parity bits $D_k$.

Figure 12:
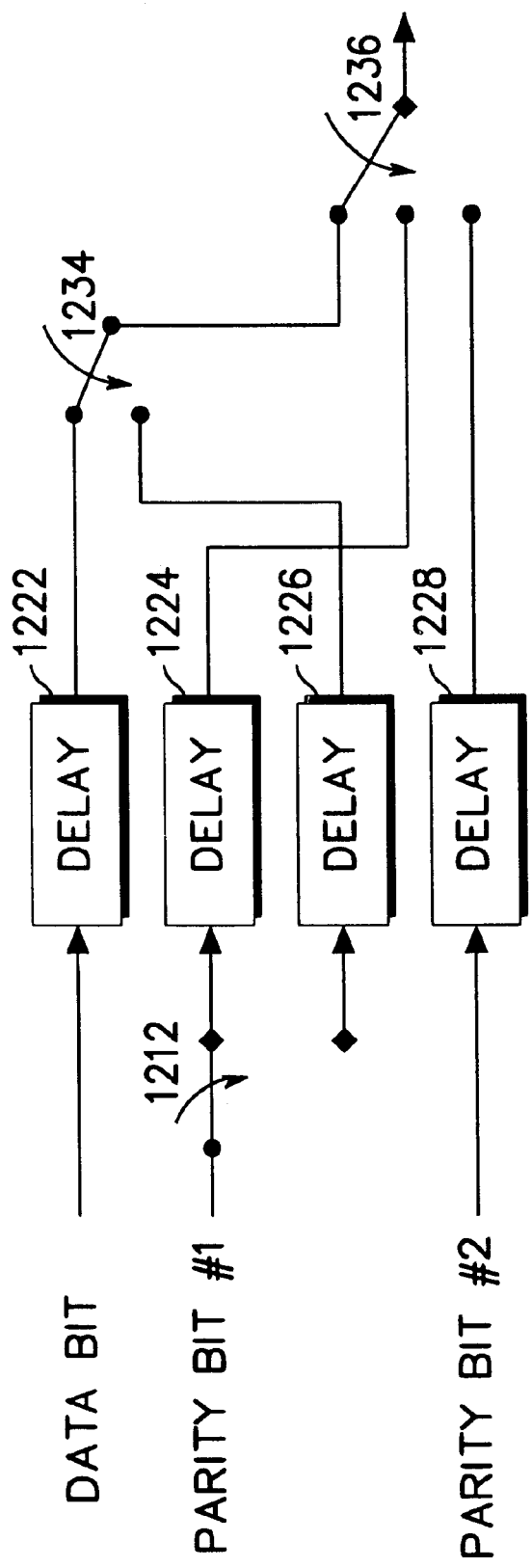
FIG. 12 is a detailed diagram illustrating a multiplexer (1050) of FIG. 10.

FIG. 12 is a diagram illustrating the multiplexer 1050. Referring to FIG. 12, the multiplexer 1050 first receives the 24 data bits $I_k$ output from the bit inserter 1010. A delay 1222 in the multiplexer 1050 then stores the received 24 data bits $I_k$.

hereafter, the multiplexer 1050 receives the 28 first parity bits $C_k$ output from the first constituent encoder 1020. A switch 1212 in the multiplexer 1050 then is connected to a delay 1224 until the first 24 bits out of the first parity bits $C_k$ are received from the first constituent encoder 1020, and the delay 1224 stores the received first parity bits $C_k$. Subsequently, the switch 1212 is connected to a delay 1226 until the remaining 8 bits out of the 32 first component code output are received from the first constituent encoder 1020, and the delay 1226 stores the remaining 8 bits of the first component code output.

Next, the multiplexer 1050 receives the 24 second parity bits $D_k$ output from the second constituent encoder 1040. A delay 1228 in the multiplexer 1050 then stores the received 24 second parity bits $D_k$.

Such sequentially generated 24 data bits $I_k$, 28 first parity bits $C_k$ and 24 second parity bits $D_k$ are applied to the multiplexer 1050. The multiplexer 1050 then stores the sequentially received data bits $I_k$, first parity bits $C_k$ and second parity bits $D_k$ in corresponding delays in the order of reception, wherein the first 24 bits and the remaining 4 bits out of the 28 first parity bits $C_k$ are separately stored in the corresponding delays. The delays 1222–1228 each are composed of cascaded memory elements and store the corresponding input bits until the above delay process is completed.

After the above delay process, a switch 1236 is connected to a switch 1234, and the switch 1234 is connected to delay 1222. Thus, an output of the delay 1222 is output via the switches 1234 and 1236. When one data bit stored in the delay 1222 is output, the switch 1234 is connected to the delay 1226, maintaining connection with the switch 1236. Then, one of the remaining first parity bits stored in the delay 1226 is output via the switches 1234 and 1236. That is, the data bit store in the delay 1222 is punctured and then, the first parity bit stored in the delay 1226 is inserted in the punctured position. Thereafter, the switch 1234 is connected again to the delay 1222, maintaining connection with the switch 1236. The above operation is repeated 8 times to puncture the data bits stored in the 1222 and insert in the punctured positions the remaining 8 first parity bits stored in the delay 1226. As a result, in the 24 data bits $I_k$ 8 inserted bits are punctured to insert the 8 first parity bits in the punctured positions (i.e., bit insert positions), thereby outputting 24 bits.

Thereafter, the switch 1236 is connected to an output of the delay 1224. Then, the 24 first parity bits $C_k$ stored in the delay 1224 are output via the switch 1236. Next, the switch 1236 is switched to the delay 1228 to output the 24 second parity bits $D_k$ stored in the delay 1228.

Figure 13:
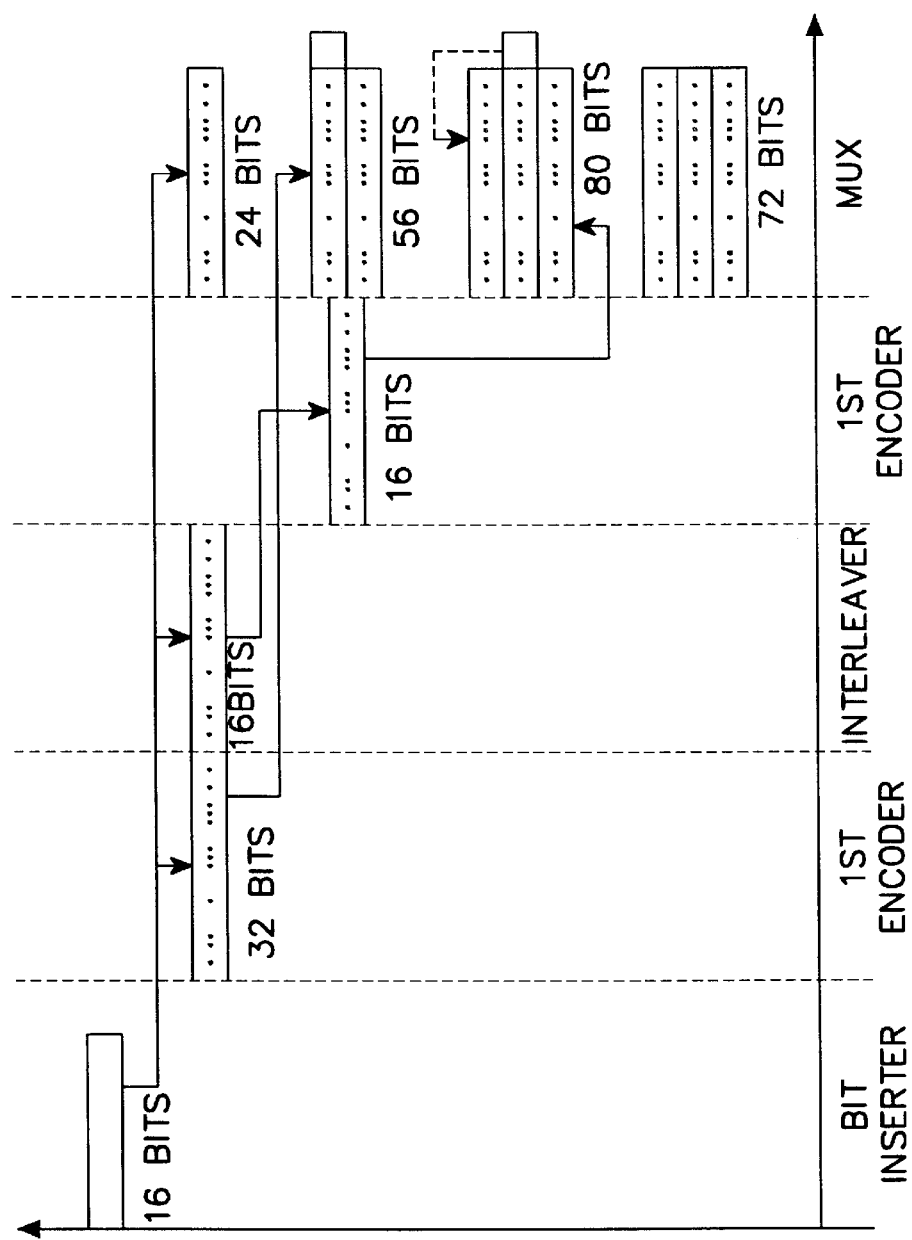
FIG. 13 is a diagram for explaining a bit processing procedure with the passage of time according to the third embodiment.

Referring to FIG. 13, in the encoder of FIG. 10 according to the third embodiment, the bit inserter 1010 inserts 8 bits in the 16 input data bits to generate the 24 data bits $I_k$. A recursive systemic constituent encoder which generates the tail bits, is used for the constituent encoder. In this case, the first constituent encoder generates 32 data bits in total, composed of 24 encoded data bits, 4 tail bits and encoded data of the 4 tail bits. When outputting the encoded data bits, the input data bits $I_k$ 8 inserted bits are punctured to insert the remaining 8 first parity bits in the bit punctured positions.

In the decoding process, the output values of the multiplexer 1050 are demultiplexed into a data bit portion, a first parity bit portion and a second parity bit portion, wherein the data bit portion is punctured with a value of "−5" at the bit inserting portion. Such processed data bits are decoded by an existing decoder. (See Claude Berrou, Alain Glavieux and Punya Thitmajshima "Near Shannon Limit Error-Correction Coding and Decoding: Turbo-Codes (1)".)

Although it is assumed that this embodiment uses the zero bits as the insert bits, it is also possible to use encoded bits or data bits predetermined with the receiver.

In this third embodiment second constituent code also can terminate having tail bit generate same as first constituent code. And, the second tail bits and tail parity bits also inserted at the position of the deleted bits. First constituent code and second constituent code output parity bits and tail bits and tail parity bit. The inserted bits can be a part of first constituent code output and a part of second constituent code output.

Fourth Embodiment

An encoder according to a fourth embodiment of the present invention performs the termination function by inserting specific data bits at predefined bit insert positions without generating the tail bits. A specified number of encoded bits, instead of insert bits, are repeated at the insert positions. In this exemplary embodiment, one frame includes 16 data bits, and the 8 known bits being zero bits are inserted in the frame at the bit positions having higher error probability. Here, the positions of the known bits are determined by experimentally detecting the positions where the most errors occur during decoding the encoded data. In addition, the respective constituent encoders are assumed to have a ⅓ coding rate.

In this embodiment, the positions having the higher error probability during decoding are experimentally determined, when the 24-bit frame data (of 16 frame data bits plus the 8 known bits) is encoded using a turbo encoder having a ⅓ coding rate. Eight bit positions having the relatively higher error probability are determined, and at the determined positions, the known bits are inserted in the data bits. After encoding, last 4 bits out of the respective parity bits are repeated to insert the repeated bits in the bit insert positions in place of the known bits. Here, the decoder knows the parity bit-inserted positions, when decoding the encoded frame data in which the specific codes are inserted. For decoding, the bits are recombined into the parity bits.

When the known bits are zero bits (in practice, the "0" bits are transmitted as "−1"), the zero bits at the insert positions are changed to a large negative value (e.g., −5) before decoding, in order to increase a reliability. In this manner, the decoder decodes the bits, knowing 8 bits which is ⅓ the 24 bits, thereby increasing the performance. In this case, the performance is increased, as the frame is shorter.

Figure 14:
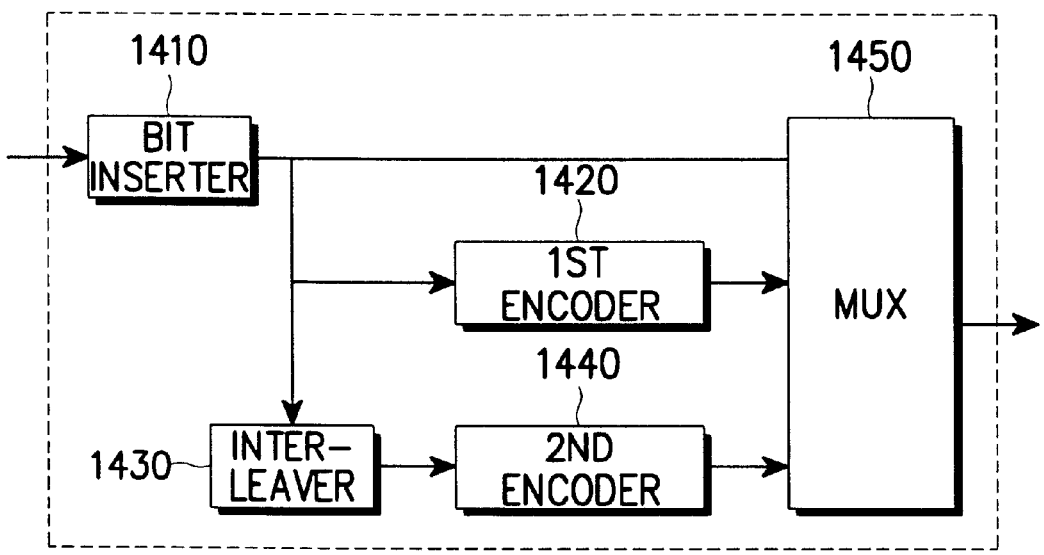
FIG. 14 is a diagram illustrating a channel encoder according to a fourth embodiment of the present invention.

FIG. 14 is a diagram illustrating a turbo encoder having a bit inserter for inserting the known bits according to the fourth embodiment of the present invention. A bit inserter 1410 includes a bit generator for generating known bits by processing input data bits, and generates data bits in the frame unit by inserting the known bits generated by the bit generator at predefined bit positions. A first constituent encoder 1420 encodes the data bits output from the bit inserter 1410. An interleaver 1430 interleaves the data bits in the frame unite, output from the bit inserter 1410, according to a predetermined rule so as to change arrangement (or sequence) of the data bits. In the exemplary embodiment, a diagonal interleaver is used for the interleaver 1430. A second constituent encoder 1440 encodes the data bits in the frame unit, output from the interleaver 1430. A recursive systemic convolutional encoder can be used for the first and second constituent encoders 1420 and 1440. A multiplexer 1450 multiplexes outputs of the bit inserter 1410, the first constituent encoder 1420 and the second constituent encoder 1440, under the control of a undepicted controller. Here, the bit inserter 1410 outputs the data bits $I_k$, the first constituent encoder 1420 the first parity bits $P1_k$ and the second constituent encoder 1440 the second parity bits $P2_k$.

Figure 15A:
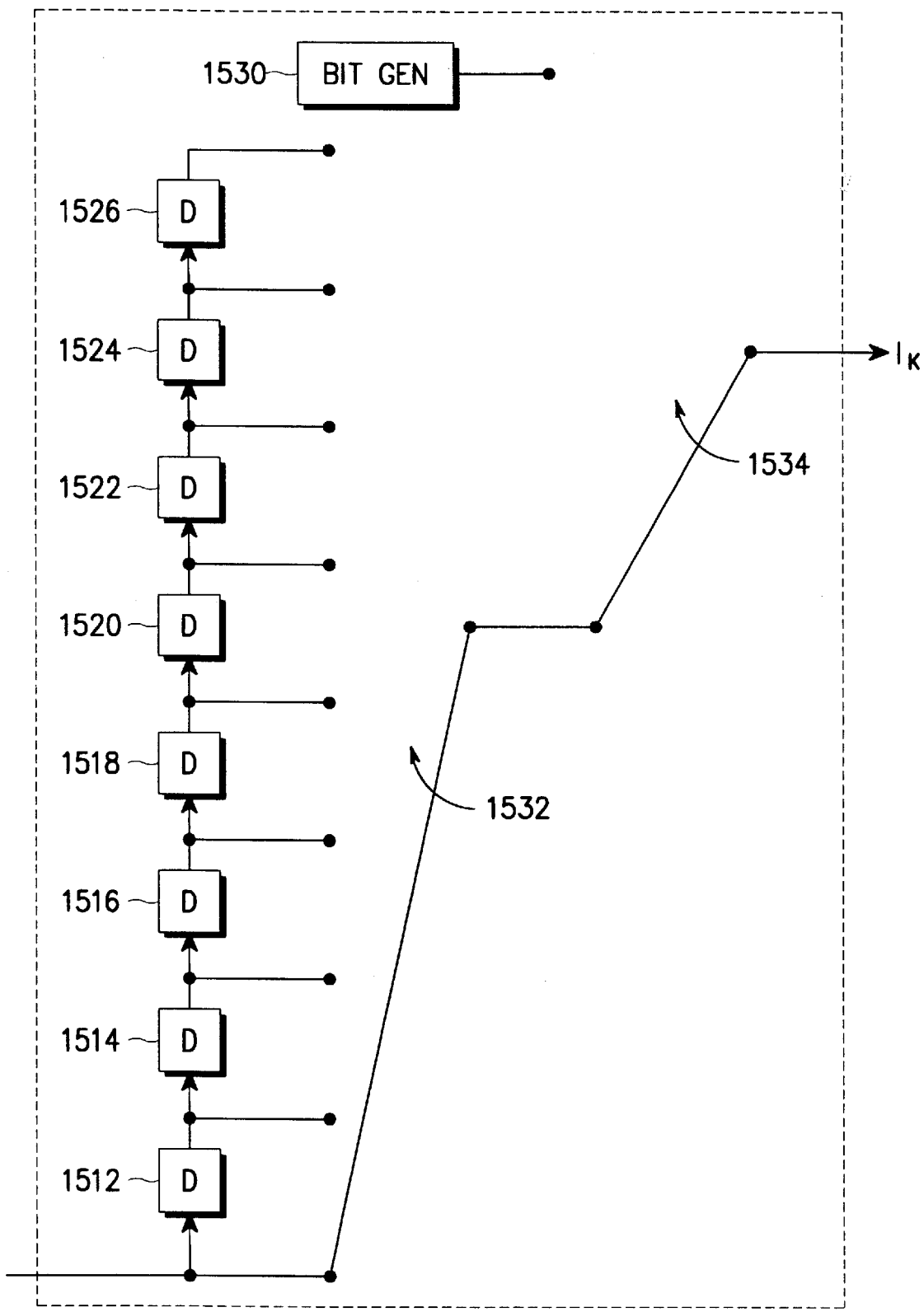
FIG. 15A is a detailed diagram illustrating a bit inserter (1410) of FIG. 14.

FIG. 15A is a diagram illustrating the bit inserter 1410 in the turbo encoder of FIG. 14. Referring to FIG. 15A, a bit generator 1530 generates known bits to be inserted in the data bits. Here, the known bits are assumed to be zero bits. Delays 1512–1526, which can be composed of memory elements such as flip-flops, may have a serial shift register structure for shifting input data bits according to a bit clock. A switch 1532 is switched to select the outputs of the delays 1512–1526, under the control of the undepicted controller. Also, the switch 1532 is switched to an output of a next delay at the positions where the known bits output from the bit generator 1530 are inserted in the data bits, under the control of the undepicted controller. That is, the switch 1532 selects a data bit being delayed by one bit, when the selected known bit is inserted in the data bits. The switch 1532 can be implemented by a multiplexer. A switch 1534 is switched to outputs of the bit generator 1530 and the switch 1532 to generate data bits $I_k$, under the control of the undepicted controller. The switch 1534 inserts the known bits in the predefined positions of the data bits by the controller.

A description will be made as to operation of inserting the known bits in the data bits with reference to FIG. 15A. The input data bits are delayed by the delays 1512–1526 according to the bit clock. Initially, the switch 1532 selects the input data bits and the switch 1534 is connected to the switch 1532. Then, the input data bits are output via the switches 1532 and 1534. In the meantime, if the bit insert position is determined, the switch 1532 is connected to the output of the delay 1512 and the switch 1534 is connected to the output of the bit generator 1530, under the control of the controller. As a result, a path for the data bits is cut off and the zero bit output from the bit generator 1530 is inserted in the corresponding bit position. In the case where the data bits should be continuously output after insertion of the zero bit, the switch 1534 is connected to the switch 1532 by the controller. That is, since the one bit-delayed data bit is selected after insertion of the zero bit, the zero bit can be inserted at the predefined position without loss of the data bit.

he zero bits are inserted in the data bits for one frame by repeating this process. Upon reception of data bits for the next frame after insertion of the zero bits, the switch 1532 is connected to a data bit input node and then, the above process is repeated again. In the case where the data bits are encoded for communication, an error probability is relatively higher at the rear portion of the frame. Accordingly, the positions where the zero bits output from the bit generator 1530 are inserted, can be mostly located at the rear portion of the frame.

Figure 15B:
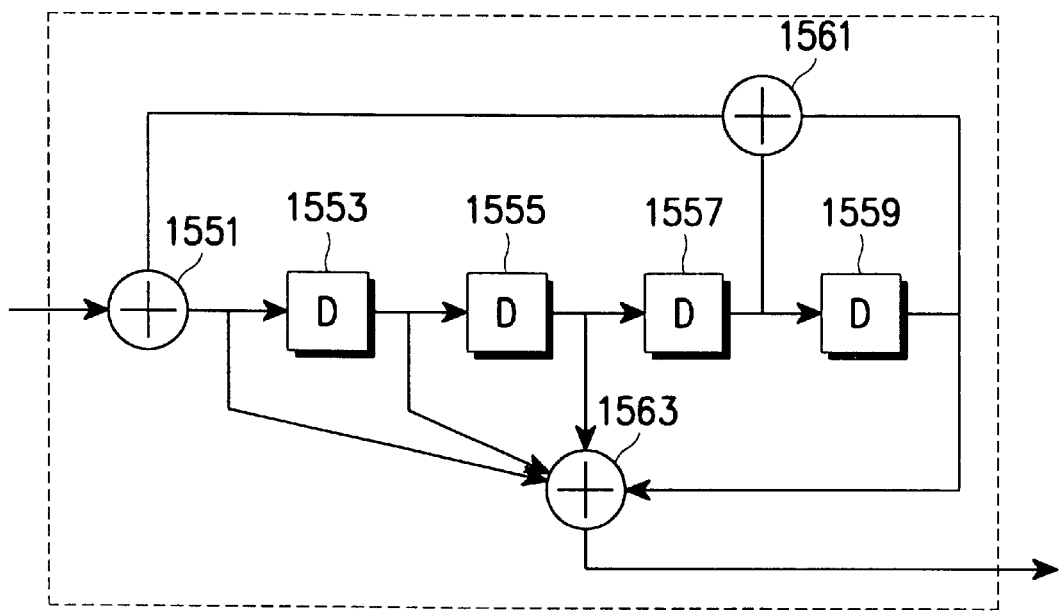
FIG. 15B is a detailed diagram illustrating a constituent encoder (1420 or 1440) of FIG. 14.

The data bits output from the bit inserter 1410 are applied to the first constituent encoder 1420 and the interleaver 1430. The interleaved data bits in the frame unit, output from the interleaver 1430, are encoded by the second constituent encoder 1440. FIG. 15B illustrates a structure of the first and second constituent encoders 1420 and 1440 of FIG. 14. As illustrated, the first and second constituent encoders 1420 and 1440 are recursive systemic convolutional encoders. In addition, the constituent encoders 1420 and 1440 have the structure which does not generate the tail bits, as shown in FIG. 15B.

While the first constituent encoder 1420 encodes the data bits output from the bit inserter 1410, the interleaver 1430 interleaves the data bits output from the bit inserter 1410 and the second constituent encoder 1440 encodes the interleaved data bits output from the interleaver 1430.

The multiplexer 1450 then multiplexes the outputs of the bit inserter 1410, the first constituent encoder 1420 and the second constituent encoder 1440, under the control of the undepicted controller.

Figure 16:
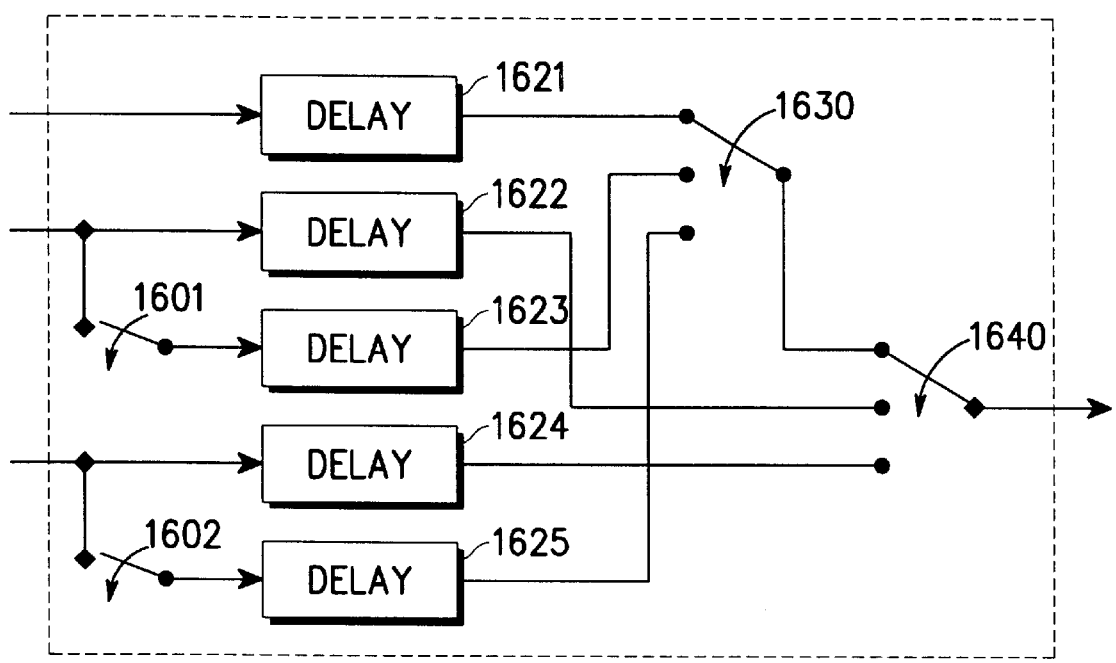
FIG. 16 is a detailed diagram illustrating a multiplexer (1450) of FIG. 14.

Referring to FIG. 16, the multiplexer 1450 sequentially receives the 24 data bits $I_k$, the 24 first parity bits $C_k$ and the 24 second parity bits $D_k$, stores first 24 bits of the respective bits in corresponding delays and stores the remaining 4 bits of the respective parity bits in the corresponding delays. Switches 1601–1640 are controlled by the undepicted controller. In addition, delays 1621–1625 each have a structure of cascaded memory elements, and the bits input to the delays are stored until the delay process is completed.

Upon completion of the delay process, the switch 1640 is connected to a switch 1630 and the switch 1630 is connected to the delay 1621. Therefore, an output of the delay 1621 is output via the switches 1630 and 1640. When one data bit stored in the delay 1621 is output, the switch 1630 is connected to the delay 1623, maintaining connection with the switch 1640. Then, one of the remaining data bits stored in the delay 1623 is output via the switches 1630 and 1640. That is, the data bit stored in the delay 1621 is punctured and then, the data bit stored in the delay 1623 is inserted in the punctured position. Thereafter, the switch 1630 is connected again to the delay 1621, continuously maintaining connection with the switch 1640. By repeating the above process 4 times, the data bits stored in the delay 1621 are punctured and then, the remaining 4 first parity bits stored in the delay 1623 are inserted in the punctured positions.

Subsequently, the switch 1630 is connected to the delay 1621, maintaining connection with the switch 1640. Then, the output of the delay 1621 is output via the switches 1630 and 1640. When one data bit stored in the delay 1621 is output, the switch 1630 is connected to the delay 1625, maintaining connection with the switch 1640. Then, one of the remaining 4 second parity bits stored in the delay 1625 is output via the switches 1630 and 1640. Thereafter, the switch 1630 is connected again to the delay 1621, continuously maintaining connection with the switch 1640. By repeating the above process 4 times, the data bits stored in the delay 1621 are punctured and then, the remaining four second parity bits stored in the delay 1625 are inserted in the punctured positions.

By way of the foregoing procedure, 8 inserted bits of the 24 data bits stored in the delay 1621 are punctured and then, the remaining 4 first parity bits stored in the delay 1623 and the remaining 4 second parity bits stored in the delay 1625 are alternately inserted in the punctured positions, thereby to output 24 bits. Accordingly, the multiplexer 1450 punctures 8 inserted bits of the data bits $I_k$ output from the bit inserter 1410 and inserts the 8 parity bits in the punctured insert positions, thereby outputting 24 data bits.

Upon completion of the above process, the switch 1640 is connected to the delay 1622. Then, the 24 first parity bits $C_k$ stored in the delay 1622 are output. Thereafter, the switch 1640 is connected to the delay 1624 to output the 24 second parity bits $D_k$ stored in the delay 1624.

Figure 17:
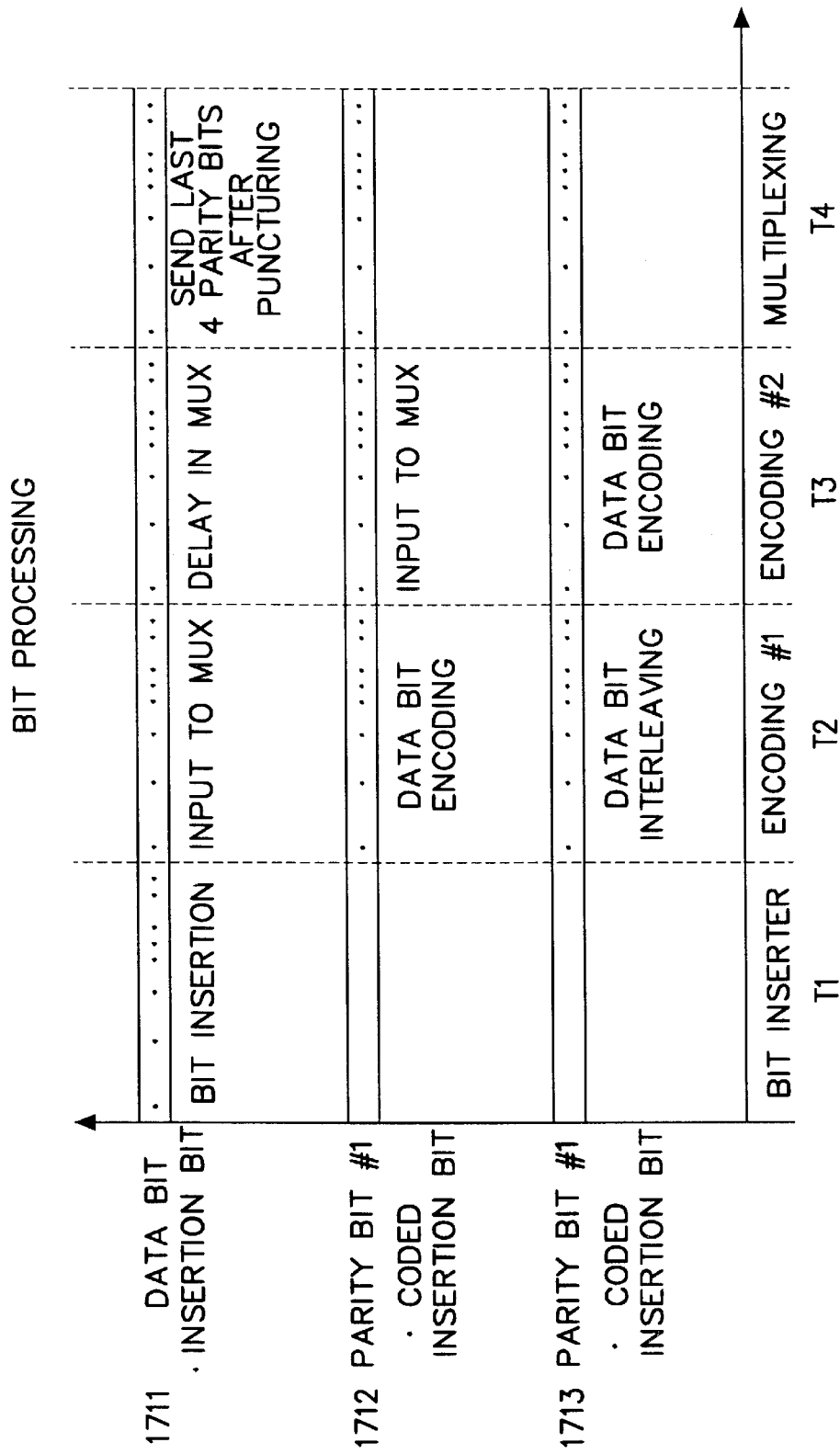
FIG. 17 is a diagram for explaining a bit processing procedure with the passage of time according to the fourth embodiment.

FIG. 17 is a timing diagram of the turbo encoder of FIG. 14 according to the fourth embodiment of the present invention. Referring to FIG. 17, in an interval T1, the bit inserter 1410 inserts the zero bits in the frame at the predefined bit positions to generate the data bits $I_k$ (see 1711). In an interval T2, the zero bit-inserted data bits $I_k$ are simultaneously applied to the multiplexer 1450, the first constituent encoder 1420 and the interleaver 1430. Then, the first constituent encoder 1420 encodes the zero bit-inserted data bits $I_k$ to generate first encoded data bits $C_k$ which are the first parity bits (see 1712), and the interleaver 1430 interleaves the zero bit-inserted data bits $I_k$ according to the predefined rule (see 1713). Thereafter, in an interval T3, the multiplexer 1450 delays the data bits $I_k$ output from the bit inserter 1410 by one frame period, the first constituent encoder 1420 inputs the first encoded data bits $C_k$ to the multiplexer 1450 and the second constituent encoder 1440 encodes the interleaved data bits $I_k$ output from the interleaver 1430 to generate second encoded data bits $D_k$ which are the second parity bits. Upon the instant that the second constituent 1440 generates the second parity bits $D_k$, the multiplexer 1450 multiplexes the data bits $I_k$, the first parity bits $C_k$ and the second parity bits $D_k$, in an interval T4.

Although FIG. 17 shows an example of parallel processing the data bits $I_k$, the first parity bits $C_k$ and the second parity bits $D_k$, it is also possible to serially output the outputs of the bit inserter 1410, the first constituent encoder 1420 and the second constituent encoder 1440 in the order of generation.

As can be appreciated from the foregoing descriptions, in the recursive systemic turbo encoder according to the fourth embodiment, the respective constituent encoders do not generate the tail bits for termination and instead, insert the known bits (i.e., zero bits) at the bit positions having the higher error probability.

Fifth Embodiment

An encoder according to a fifth embodiment of the present invention inserts bits having a specific logic in the data bits at predefined bit insert positions having a higher error occurrence probability. Constituent encoders encode the bit-inserted data bits and generate tail bits to be added to the encoded data bits. That is, the encoder according to the fifth embodiment performs the termination function by bit inserting and tail bit adding.

The number of the insert bits is determined by the input data bit number of the encoder, the number of the output code symbols, a constraint length and a code rate. That is, when the input data bit number of the encoder is N, the number of output code symbols of the encoder is M, the constraint length is L and the code rate is 1/K, the number of insert bits is $(M-KN-2(K-1)(L<1))/(K-1)$. From this, when the input data bit number of the encoder is 16, the number of output code symbols is 72, the constraint length is 5 and the code rate is ⅓, the number of insert bits is 4.

Actually, as the number of the insert bits increases, the encoder has the increased performance. The encoder according to this embodiment can maximally improve its performance by inserting the known bits as many as possible, with the given input data bit number and output code symbol number. In this embodiment, when 12 insert bits are used and the data bits are transmitted after encoding, it is possible to improve the performance of the encoder by transmitting only the encoded symbols, without transmitting the inserted bits, for maximal bit inserting.

Figure 18:
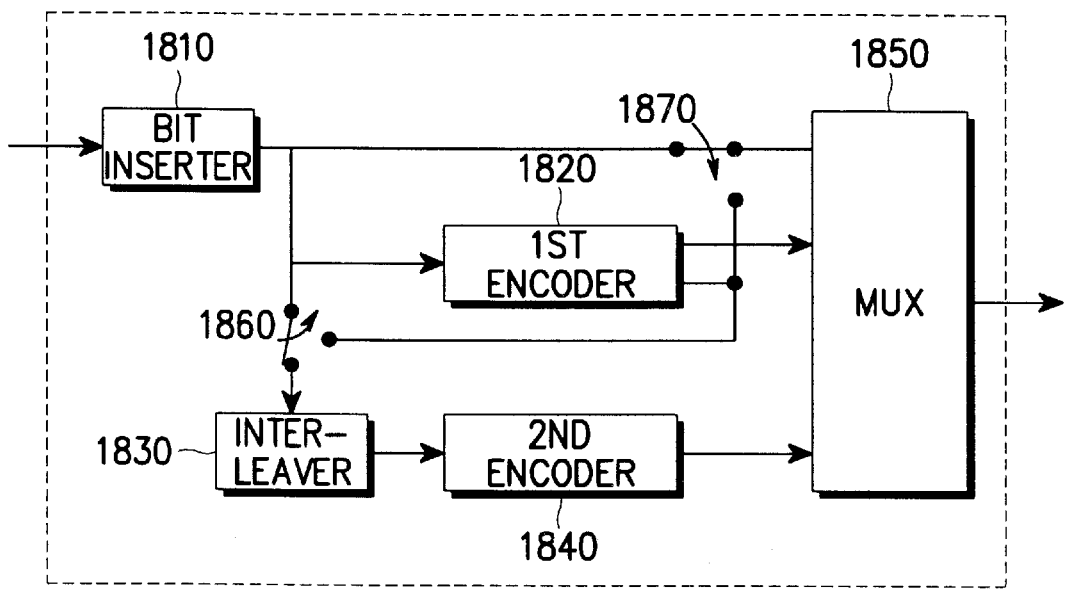
FIG. 18 is a diagram illustrating a channel encoder according to a fifth embodiment of the present invention.
Figure 19:
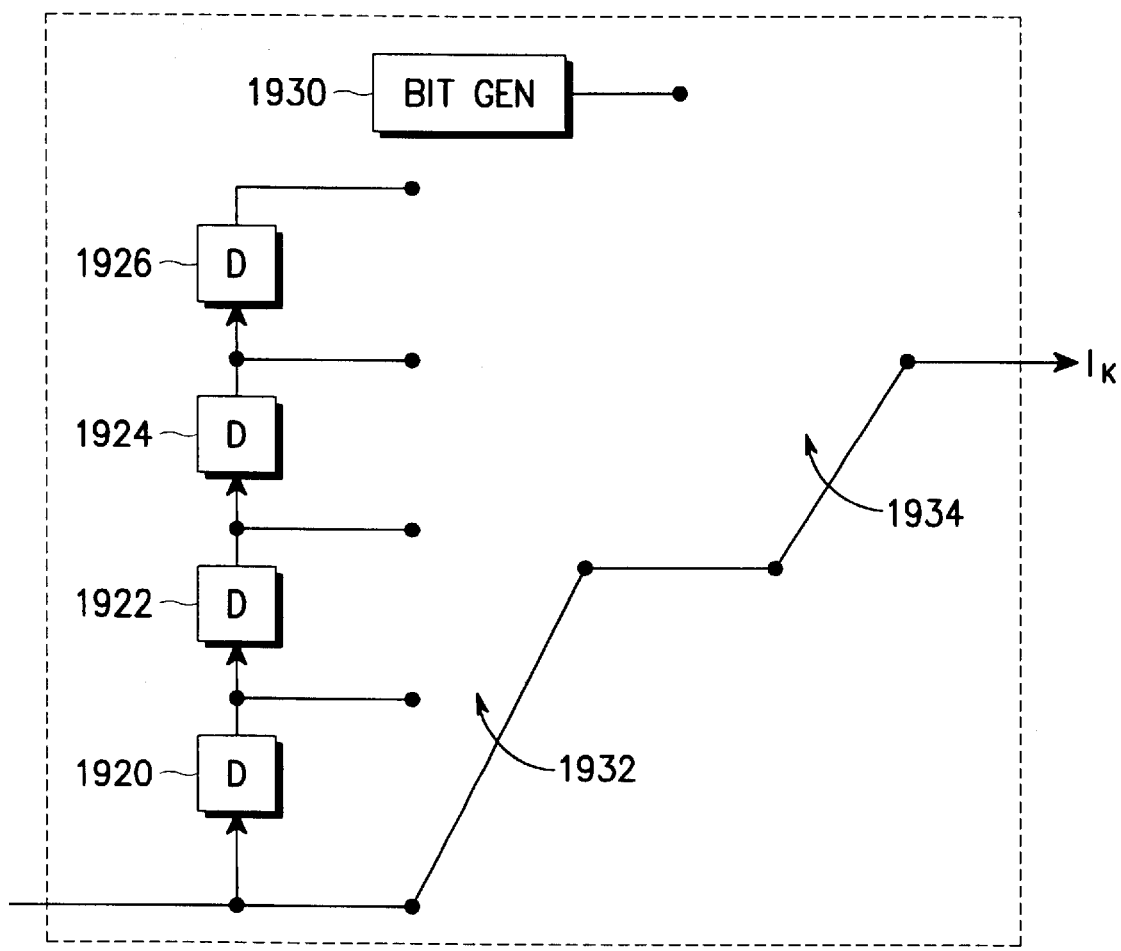
FIG. 19 is a detailed diagram illustrating a bit inserter (1810) of FIG. 18.

FIG. 18 is a diagram illustrating an encoder according to the fifth embodiment of the present invention. Referring to FIG. 18, a bit inserter 1810 receives 16 input bits. Here, the bit inserter 1810 has a structure similar to the bit inserter 1410 of FIG. 15A except that it includes 4 memories as shown in FIG. 19. The bit inserter 1810 inserts 4 zero bits at 4 predefined bit positions in a frame, having a higher error probability, under the control of a undepicted controller. The structure of the bit inserter 1810 is shown in FIG. 19.

In this embodiment, the bit inserter 1810 outputs the 20 data bits $I_k$, which are applied in common to the multiplexer 1850, the first constituent encoder 1820 and the interleaver 1830. The interleaved data bits $I_k$ output from the interleaver 1830 are applied to the second constituent encoder 1840. Here, the first constituent encoder 1820 is a recursive systemic constituent encoder shown in FIG. 20, which has a structure for generating tail bits to be added to the encoded bits. In addition, an encoder, shown in FIG. 15B, having a structure which does not generate the tail bits for termination is used for the second constituent encoder 1840.

Figure 20:
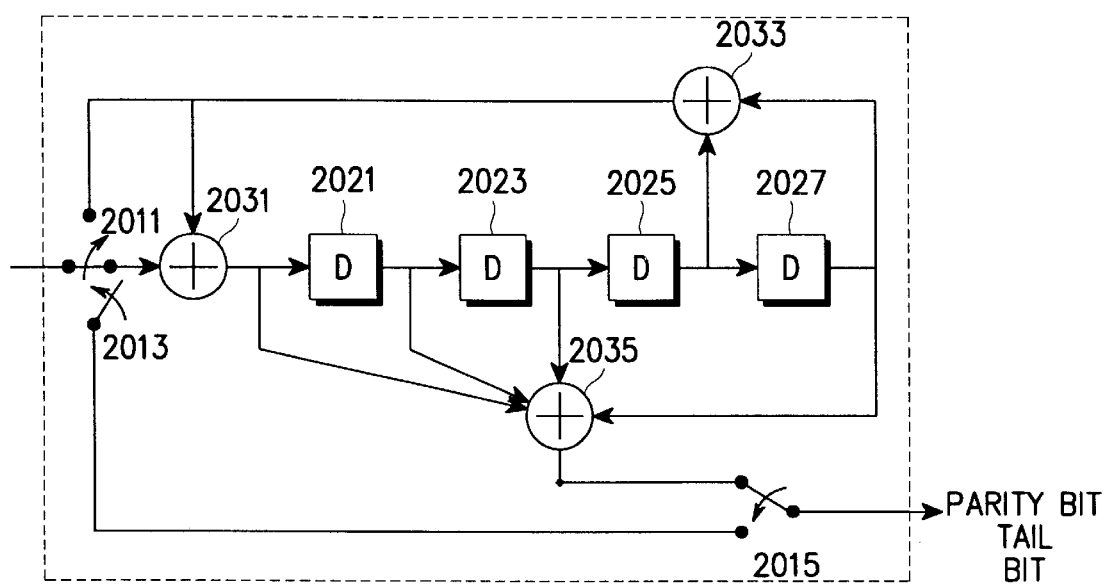
FIG. 20 is a detailed diagram illustrating a constituent encoder (1820 or 1840) of FIG. 18.

Referring to FIG. 20, operation of the first constituent encoder 1820 will be described. For encoding, a switch 2011 connects an input node to an exclusive OR gate 2031, a switch 2013 maintains an OFF state and the switch 2015 is connected to an exclusive OR gate 2035. Then, the 20 data bits $I_k$ are sequentially applied to delays 2021–2027 via the switch 2011 and the exclusive OR gate 2031, and the exclusive OR gate 2035 outputs encoded data bits. When the data bits $I_k$ are all encoded by the delays 2021–2027 and the exclusive OR gate 2035 in this manner, the switch 2011 connects the exclusive OR gate 2033 to the exclusive OR gate 2031, for termination. Then, zero bits are generated by exclusive ORing the outputs being fed back, stored in the delays 2021–2027 and output through the switch 2015. Here, the zero values stored in the delays 2021–2027 become the tail bits and are output through switch 2015. The number of the tail bits corresponds to the number of the delays in the constituent encoder 1820. In FIG. 20, the constituent encoder 1820 generates 4 tail bits per frame and also generates 4 tail bits parity (encoded bits for the respective tail bits0.

Accordingly, the first constituent encoder 1820 generates 20 first parity bits $C_k$ and, upon processing the last data bit (i.e., the 20$^{th}$ data bit), connects the switch 2011 to the exclusive OR gate 2033, the switch 2013 to the switch 2011 and the switch 2015 to the switch 2013; the same process is repeated four times to generate 4 tail bits $T_k$. Through this procedure, the 24 first parity bits $C_k$ and the 4 tail bits are output to the multiplexer 1850. A switch 1860 is switched to the interleaver 1830 to apply the tail bits $T_k$ to the interleaver 1830 and the switch 1870 is connected to the multiplexer 1850 to apply the tail bits $T_k$ to the multiplexer 1850.

In addition, the interleaver 1830 interleaves the 20 data bits $I_k$ output from the bit inserter 1810 and the 4 tail bits output from the first constituent encoder 1820, and provides the 24 interleaved data bits to the second constituent encoder 1840. The second constituent encoder 1840 then encodes the interleaved data bits in the same manner as the first constituent encoder 1440 of FIG. 14 to generate 24 second parity bits $D_k$, which are applied to the multiplexer 1850.

The interleaved data bits in the frame unit, output from the interleaver 1830, are encoded by the second constituent encoder 1840 which has the same structure as that shown in FIG. 15B. The second constituent encoder 1840 is a recursive systemic convolutional encoder, as shown in FIG. 15B. In addition, the second constituent encoder 1840 has a structure which does not generate the tail bits.

The multiplexer 1850 then punctures 4 inserted bits of the data bits $I_k$, and inserts the 4 first parity bits $C_k$ in the punctured positions, and selectively outputs the remaining 24 first parity bits $C_k$ and 24 second parity bits $D_k$. The inserted 4 bits may be first constituent encode tail bits or tail bits parity.

Figure 21:
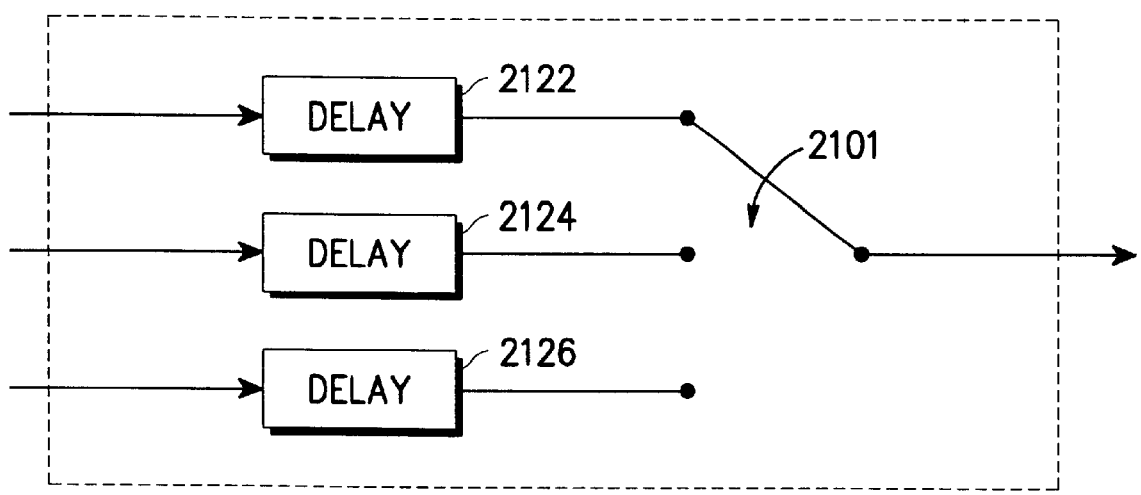
FIG. 21 is a detailed diagram illustrating a multiplexer (1850) of FIG. 18.

FIG. 21 is a diagram illustrating the multiplexer 1850. Referring to FIG. 21, the multiplexer 1850 first receives the 20 data bits $I_k$ output from the bit inserter 1810. A delay 2122 in the multiplexer 1850 then stores the received 20 data bits $I_k$.

Thereafter, the multiplexer 1850 stores the 24 first parity bits $C_k$ output from the first constituent encoder 1820 in a delay 2124, and stores the 4 tail bits $T_k$ output from the first constituent encoder 1820 in a delay 2122. Next, the multiplexer 1850 stores the 24 second parity bits $D_k$ output from the second constituent encoder 1840 in a delay 2126.

The delays 1222–1228 each are composed of cascaded memory elements and store the corresponding input bits until the above delay process is completed.

After the above delay process, a switch 2101 is connected to the delay 2122 to output the bits stored in the delay 2122. Subsequently, the switch 2101 is connected to the delay 2124 to output the bits stored in the delay 2124. Thereafter, the switch 2101 is connected to the delay 2126 to output the bits stored in the delay 2126.

Sixth Embodiment

Figure 22:
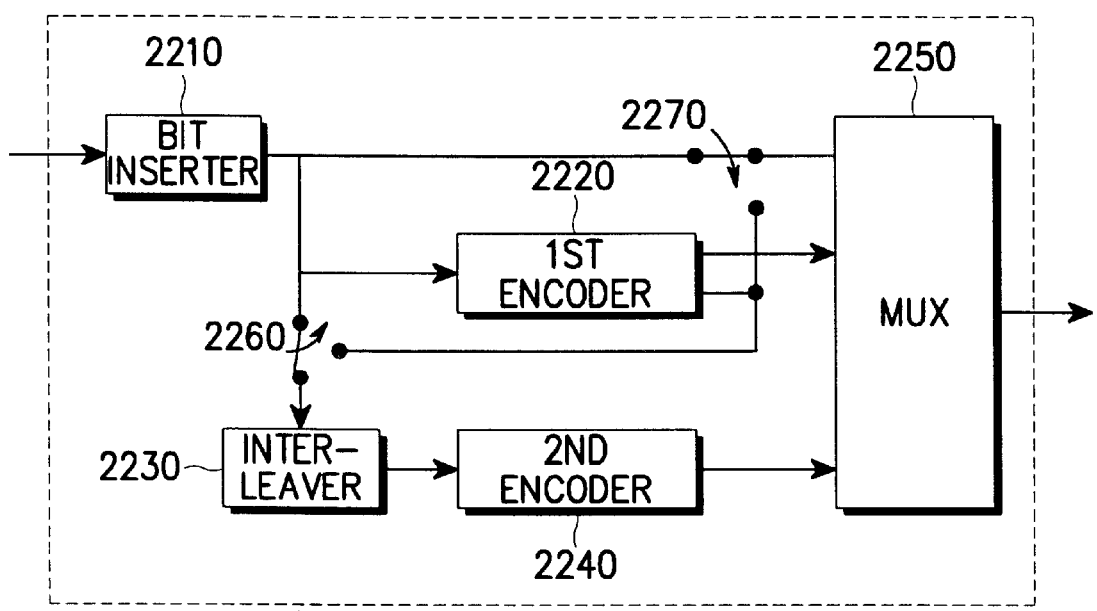
FIG. 22 is a diagram illustrating a channel encoder according to a sixth embodiment of the present invention.

An encoder according to a sixth embodiment of the present invention has the same operation as that of fifth embodiment, and punctures data bits to insert known bits in the punctured bit insert positions, and 4 tail parity bits from the first constituent encoder are repeatedly transmitted at the positions. FIG. 22 is a diagram illustrating an encoder according to the sixth embodiment of the present invention, wherein operations before a multiplexer 2250 is the same as that of the fifth embodiment.

Figure 23:
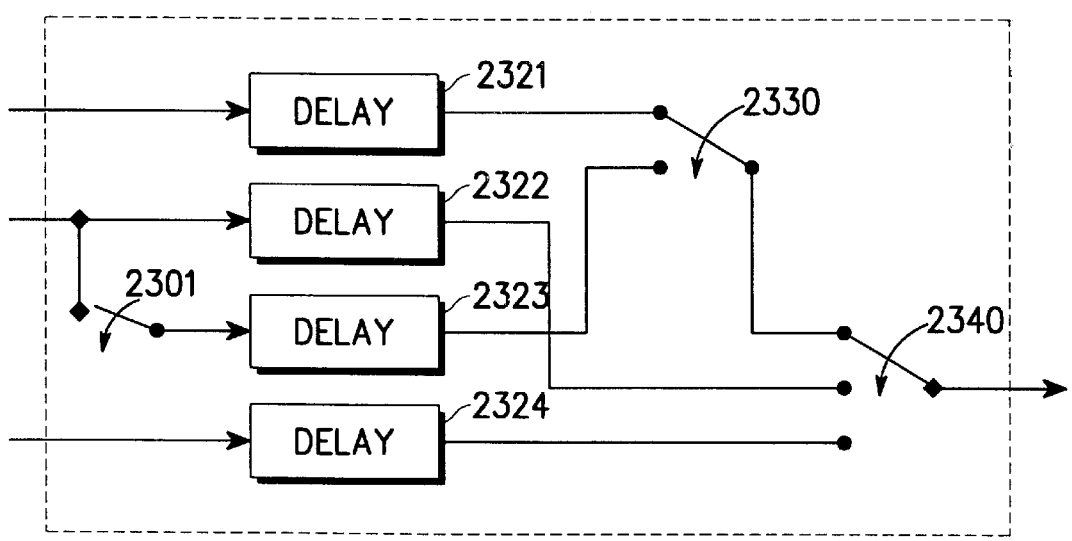
FIG. 23 is a detailed diagram illustrating a multiplexer (2250) of FIG. 22.

Referring to FIG. 23, the multiplexer 2250 first receives the 20 data bits $I_k$ output from the bit inserter 2210. A delay 2321 in the multiplexer 2250 then stores the received 20 data bits $I_k$. Thereafter, the multiplexer 2250 stores the 24 first parity bits $C_k$ output from the first constituent encoder 2220 in a delay 2322, stores the last 4 first parity bits in the delay 2323, and stores the 4 tail bits $T_k$ output from the first constituent encoder 2220 in a delay 2321. Next, the multiplexer 2250 stores the 24 second parity bits $D_k$ output from the second constituent encoder 2240 in a delay 2324.

The delays 2322–2328 each are composed of cascaded memory elements and store the corresponding input bits until the above delay process is completed.

After the above delay process, a switch 2340 is connected to a switch 2330 and the switch 2330 is connected to the delay 2321. Thus, an output of the delay 2321 is output via the switches 2330 and 2340. When one data bit stored in the delay 2321 is output, the switch 2330 is connected to the delay 2323, maintaining connection with the switch 2340. Then, one of the remaining first parity bits stored in the delay 2323 is output via the switches 2330 and 2340. That is, the data bit stored in the delay 1121 is punctured and then, the first parity bit stored in the delay 2323 is inserted in the punctured position. Thereafter, the switch 2330 is connected again to the delay 2321, maintaining connection with the switch 2340. The above operation is repeated 4 times to puncture the data bits stored in the 2321 and insert in the punctured positions the remaining 4 first parity bits stored in the delay 2323.

In this manner, the 24 data bits $I_k$ stored in the delay 2321 are punctured to insert in the punctured positions the remaining 4 first parity bits stored in the delay 2323, thereby outputting 24 bits. As a result, the multiplexer 2250 punctures the 24 data bits $I_k$ output from the bit inserter 2210 to insert the 4 parity bits in the punctured bit insert positions, thereby outputting 24 data bits.

Thereafter, the switch 2340 is connected to an output of the delay 2322. Then, the 24 first parity bits $C_k$ stored in the delay 2322 are output via the switch 2340. Next, the switch 2340 is switched to the delay 2324 to output the 24 second parity bits $D_k$ stored in the delay 2324.

Seventh Embodiment

Figure 24:
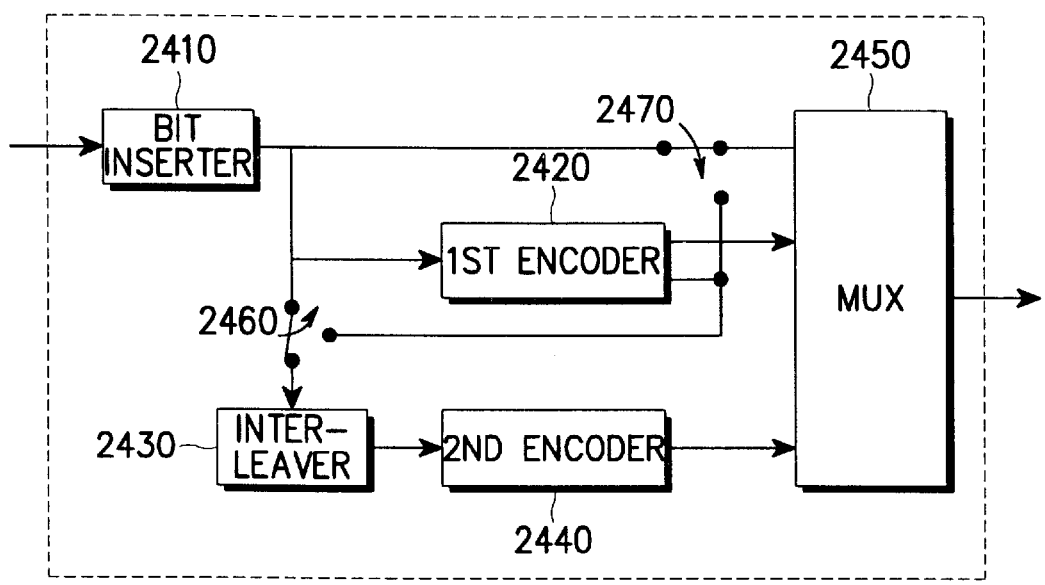
FIG. 24 is a diagram illustrating a channel encoder according to a seventh embodiment of the present invention.

An encoder according to a seventh embodiment of the present invention has the same operation as that of fifth embodiment, and punctures data bits to insert known bits in the punctured bit insert positions, and 4 tail parity bits from the second constituent encoder are repeatedly transmitted at the positions. FIG. 24 is a diagram illustrating an encoder according to the seventh embodiment of the present invention, wherein operations before a multiplexer 2450 is the same as that of the fifth embodiment.

Referring to FIG. 24, the multiplexer 2450 first receives the 20 data bits $I_k$ output from the bit inserter 2410. A delay 2521 in the multiplexer 2450 then stores the received 20 data bits $I_k$ Thereafter, the multiplexer 2450 stores 24 first parity bits $C_k$ output from the first constituent encoder 2420 in a delay 2522, and stores 4 tail bits $T_k$ output from the first constituent encoder 2420 in a delay 2521. Next, the multiplexer 2450 receives 24 second parity bits $D_k$ output from a second constituent encoder 2440. The multiplexer 2450 constructed as shown in FIG. 25 multiplexes the data bits $I_k$, and the parity bits $C_k$ and $D_k$ output respectively from the bit inserter 2410, the first constituent encoder 2420 and the second constituent encoder 2440.

Figure 25:
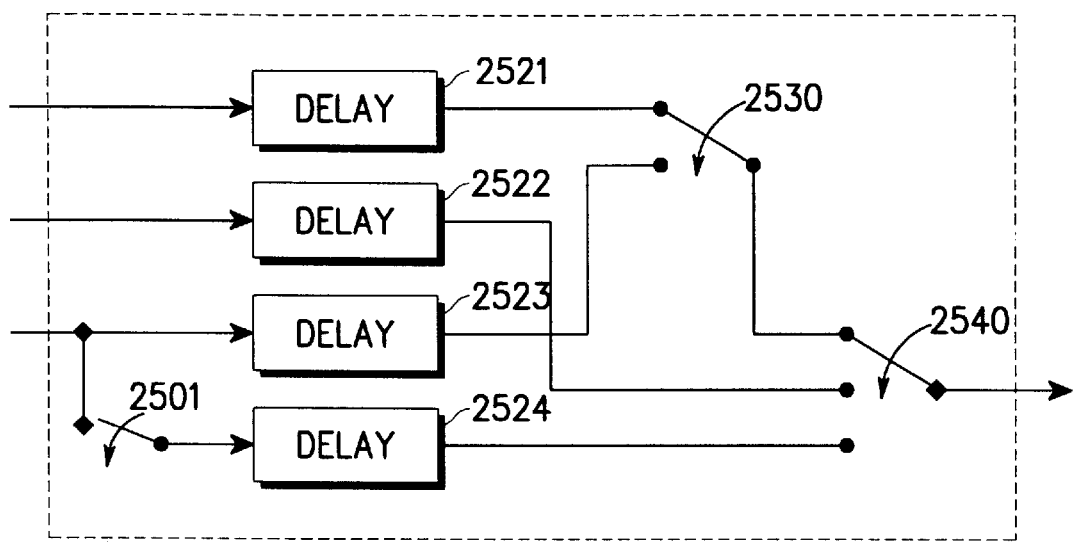
FIG. 25 is a detailed diagram illustrating a multiplexer (2450) of FIG. 24.

FIG. 25 is a diagram illustrating the multiplexer 2450 according to the seventh embodiment of the present invention.

Referring to FIG. 25, the delay 2523 stores the second parity bits $D_k$ and a delay 2524 stores the last 4 bits of the second parity bits $D_k$. A switch 2501 is controlled by a undepicted controller. Further, the delays 2521–2524 each are composed of cascaded memory elements and store the corresponding input bits until the above delay process is completed.

Upon completion of the delay process, a switch 2540 is connected to a switch 2530 and the switch 2530 is connected to the delay 2521. Thus, an output of the delay 2521 is output via the switches 2530 and 2540. When one data bit stored in the delay 2521 is output, the switch 2540 is connected to the delay 2524 to output one of the last 4 second parity bits stored in the delay 2524. That is, the data bit is punctured and then, the second parity bit stored in the delay 2524 is inserted in the punctured bit insert position. Thereafter, the switch 2530 is connected again to the delay 2521, maintaining connection with the switch 2540. The above operation is repeated 4 times to puncture the data bits stored in the 2521 and insert in the punctured bit insert positions the last 4 second parity bits stored in the delay 2524.

In this manner, the 24 data bits $I_k$ stored in the delay 2521 are punctured to alternately insert the last 4 second parity bits stored in the delay 2524, thereby outputting 24 bits. As a result, the multiplexer 2450 punctures the 24 data bits $I_k$ output from the bit inserter 2410 to insert the 4 second parity bits in the punctured bit insert. positions, thereby outputting 24 data bits.

Thereafter, the switch 2540 is connected to an output of the delay 2522. Then, the 24 first parity bits $C_k$ stored in the delay 2522 are output via the switch 2540. Next, the switch 2540 is switched to the delay 2524 to output the 24 second parity bits $D_k$ stored in the delay 2524.

Eighth Embodiment

An encoder according to an eighth embodiment of the present invention inserts bits having a specific logic in data bits at bit positions having a higher error occurrence probability. A constituent encoder encodes the bit-inserted data bits and independently (or internally) generates tail bits to be added to the encoded data bits. That is, the encoder according to this embodiment performs the termination function by bit inserting and tail bit adding.

Figure 26:
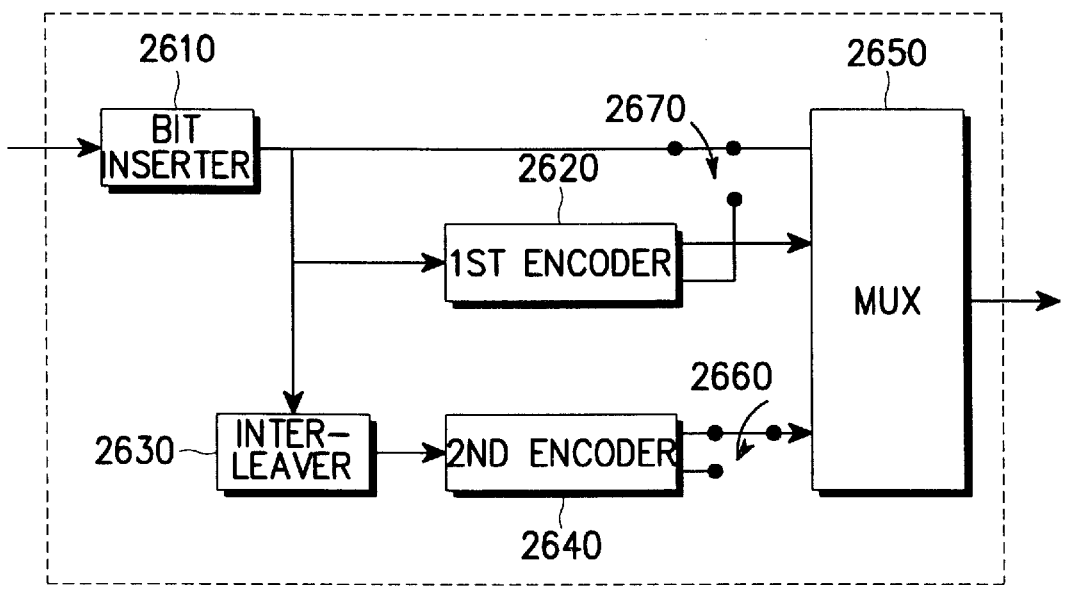
FIG. 26 is a diagram illustrating a channel encoder according to an eighth embodiment of the present invention.

FIG. 26 is a diagram illustrating the encoder according to the eighth embodiment of the present invention. Referring to FIG. 26, a bit inserter 2610 receives 16 input bits. Here, the bit inserter 2610 has a structure similar to the bit inserter 1810 of FIG. 19. The bit inserter 2610 inserts 4 zero bits at 4 data bit positions in a frame, having a higher error probability, under the control of a undepicted controller. Accordingly, in this embodiment, the bits inserter 2610 outputs 20 data bits $I_k$, which are applied in common to the multiplexer 2650, the first constituent encoder 2620 and the interleaver 2630. Further, the interleaved data bits $I_k$ output from the interleaver 2630 are applied to the second constituent encoder 2640. Here, the first constituent encoder 2620 and the second constituent encoder 2640 are recursive systemic constituent encoders shown in FIG. 20, which generate tail bits to be added to the encoded data bits.

The first constituent encoder 2620 generates 24 first parity bits $C_k$ and 4 tail bits $T_k$, in which the first parity bits $C_k$ are applied to the multiplexer 2650 and the tail bits $T_k$ to a switch 2670. The switch 2670 connected to the multiplexer 2650, is switched to receive the data bits $I_k$ output from the bit inserter 2610 or the tail bits $T_k$ output from the first constituent encoder 2620, under the control of a undepicted controller. The switch 2670 punctures the data bits $I_k$ to insert the tail bits $T_k$ output from the first constituent encoder 2620 in the punctured bit insert positions, and provides them to the multiplexer 2650.

The interleaver 2630 interleaves the 20 data bits $I_k$ output from the bit inserter 2610 and provides the interleaved data bits to the second constituent encoder 2640. The second constituent encoder 2640 then generates 24 second parity bits $D_k$ and 4 tail bits $T_k$. A switch 2660 selectively applies the second parity bits $D_k$ and the 4 tail bits $T_k$, output from the second constituent encoder 2640, to the multiplexer 2650.

Figure 27:
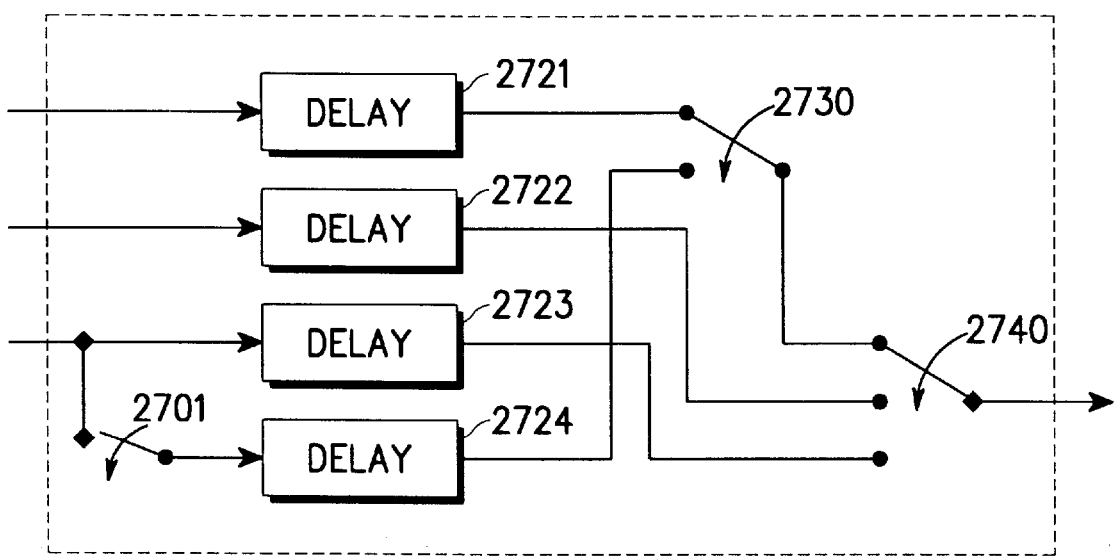
FIG. 27 is a detailed diagram illustrating a multiplexer (2650) of FIG. 26.

FIG. 27 is a diagram illustrating the multiplexer 2650. Referring to FIG. 27, the multiplexer 2650 first receives the 20 data bits $I_k$ output from the bit inserter 2610. A delay 2721 in the multiplexer 2650 then stores the received 20 data bits $I_k$.

Thereafter, the multiplexer 2650 stores the 24 first parity bits $C_k$ output from the first constituent encoder 2620 in a delay 2722, and stores the 4 tail bits $T_k$ output from the first constituent encoder 2620 in a delay 2721. Next, the multiplexer 2650 stores the 24 second parity bits $D_k$ output from the second constituent encoder 2640 in a delay 2723 and stores 4 tail bits $T_k$ output from the second constituent encoder 2640 in a delay 2724.

The delays 2721–2724 each are composed of cascaded memory elements and store the corresponding input bits until the above delay process is completed.

Upon completion of the delay process, a switch 2740 is connected to a switch 2730 and the switch 2730 is connected to the delay 2721. Thus, an output of the delay 2721 is output via the switches 2730 and 2740. When one insert bit stored in the delay 2721 is output, the switch 2730 is connected to the delay 2724, maintaining connection with the switch 2740, to output one of the 4 tail bits stored in the delay 2724. That is, the data bit stored in the delay 2721 is punctured and then, the tail bit stored in the delay 2724 is inserted in the punctured bit insert position. Thereafter, the switch 2730 is connected again to the delay 2721, maintaining connection with the switch 2740. The above operation is repeated 4 times to puncture the data bits stored in the 2721 and insert in the punctured bit insert positions the 4 tail bits stored in the delay 2724.

Thereafter, the switch 2740 is connected to an output of the delay 2722 to output the first parity bits $C_k$ stored in the delay 2722. Next, the switch 2740 is switched to the delay 2723 to output the second parity bits $D_k$ stored in the delay 2723.

As can be appreciated from the foregoing descriptions, in the recursive systemic turbo encoder according to the eighth embodiment, the respective constituent encoders do not generate the tail bits for termination and instead, insert the known bits (i.e., zero bits) at the bit positions having the higher error probability.

Ninth Embodiment

An encoder according to a ninth embodiment of the present invention inserts 6 bits having a specific logic in data bits at bit insert positions having a higher error occurrence probability. Data bits are punctured at bit insert positions and in the punctured bit insert positions, a first constituent encoder performs tailing and interleaves the data bits including the tail bits. When encoding the interleaved data bits, a second constituent encoder inserts the 6 bits exceeding the frame size in the punctured bit insert positions.

Figure 28:
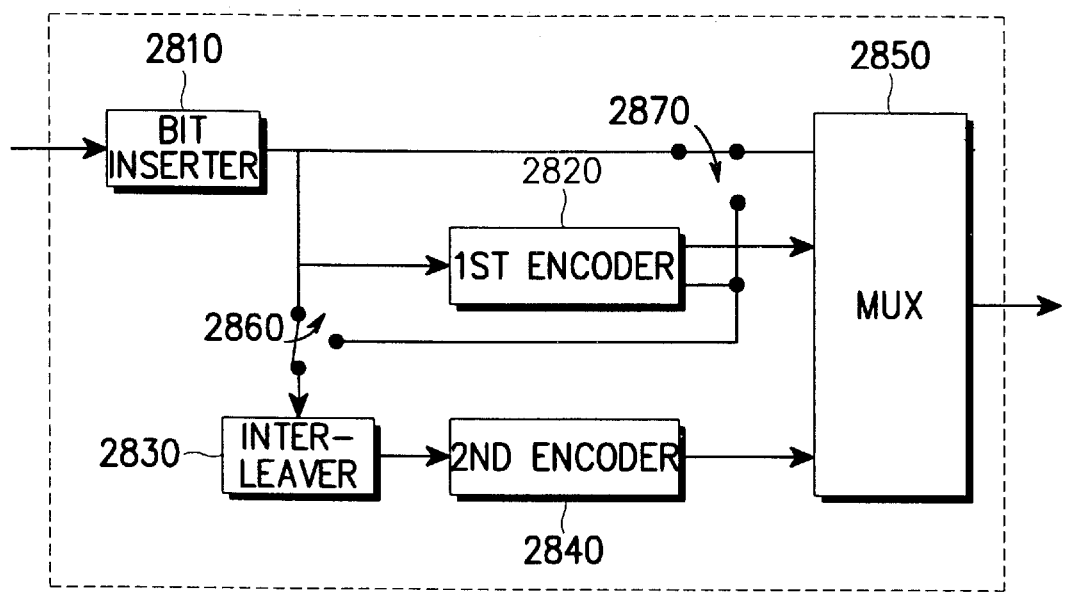
FIG. 28 is a diagram illustrating a channel encoder according to a ninth embodiment of the present invention.
Figure 29:
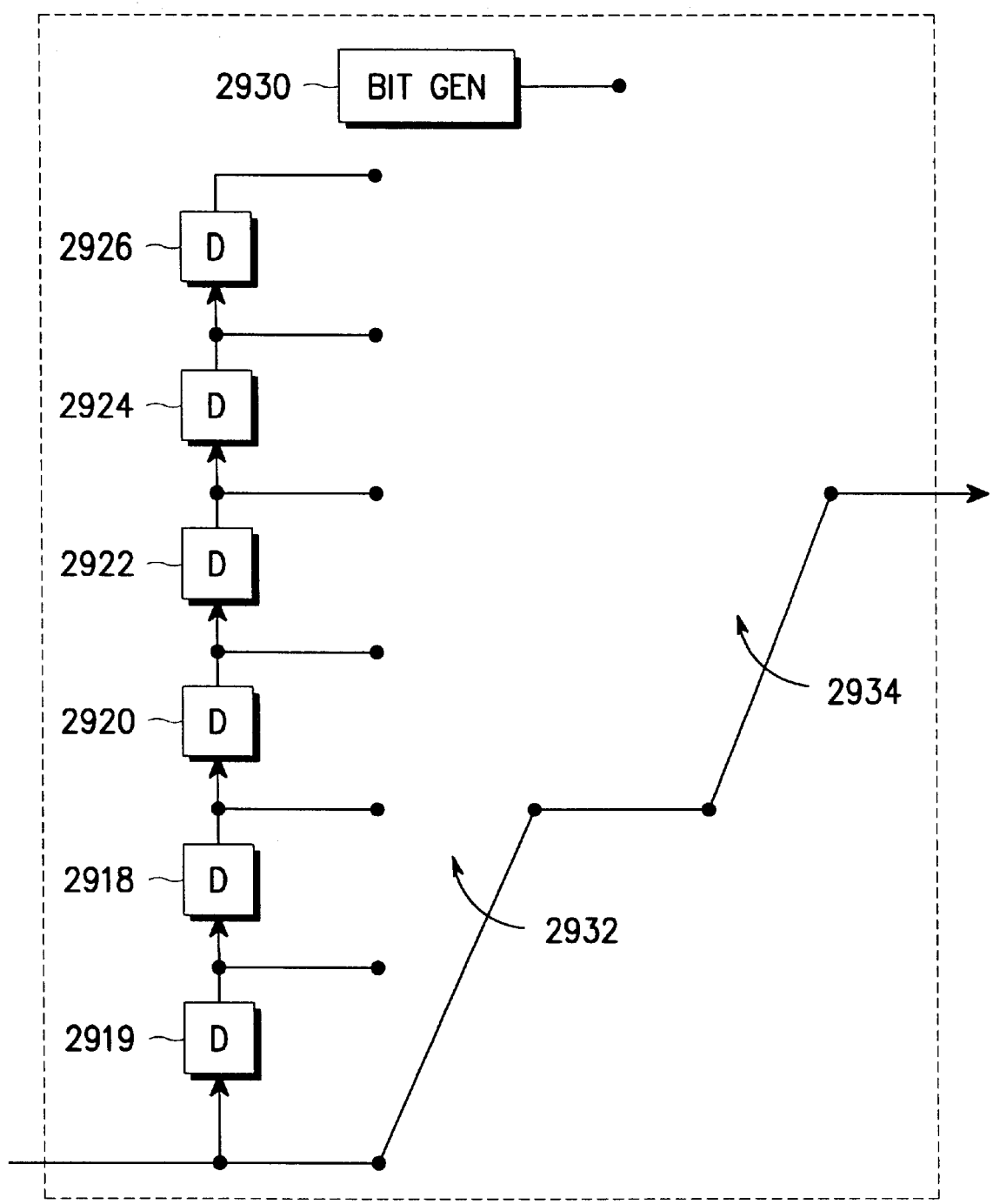
FIG. 29 is a detailed diagram illustrating a bit inserter (2810) of FIG. 28.

FIG. 28 is a diagram illustrating the encoder according to the ninth embodiment of the present invention. Referring to FIG. 28, a bit inserter 2810 receives 16 input bits. Here, the bit inserter 2810 has a structure similar to the bit inserter 1410 of FIG. 15A, except that it includes 6 delays. The bit inserter 2810 inserts 6 zero bits at 6 data bit positions in a frame, having a higher error probability, under the control of a undepicted controller.

Accordingly, in this embodiment, the bits inserter 2810 outputs 22 data bits $I_k$, which are applied in common to the multiplexer 2850, the first constituent encoder 2820 and the interleaver 2830. Further, the interleaved data bits $I_k$ output from the interleaver 2830 are applied to the second constituent encoder 2840. Here, the first constituent encoder 2820 is a recursive systemic constituent encoder shown in FIG. 20, which generate the tail bits to be added to the encoded bits. The second constituent encoder 2840 is a recursive systemic constituent encoder shown in FIG. 15B, which does not generate the tail bits.

The first constituent encoder 2820 having the structure of FIG. 20, generates 4 tail bits per frame and generates 4 encoded bits for the respective tail bits. Accordingly, the first constituent encoder 2820 generates 26 first parity bits $C_k$ and, upon processing the $22^{nd}$ data bit, connects the switch 2011 to the exclusive OR gate 2033, the switch 2013 to the switch 2011 and the switch 2015 to the switch 2013; the same process is repeated 4 times to generate 4 tail bits. Through this procedure, the first constituent encoder 2820 generates the 24 first parity bits $C_k$ and the 4 tail bits, wherein the first parity bits $C_k$ are applied to the multiplexer 2850 and the tail bits $T_k$ is applied to the interleaver 2830 and the multiplexer 2850 via a switch 2870.

In addition, the interleaver 2830 interleaves the 22 data bits $I_k$ output from the bit inserter 2810 and the 4 tail bits output from the second constituent encoder 2840, and provides the interleaved 26 data bits to the second constituent encoder 2840. The second constituent encoder 2840 then encodes the interleaved data bits in the same manner as the first constituent encoder 2820 to generate 26 second parity bits $D_k$, which are applied to the multiplexer 2850. That is, the interleaved data bits in the frame unit, output from the interleaver 2830, are encoded by the second constituent encoder 2840. The second constituent encoder 2840 is a recursive systemic convolutional encoder shown in FIG. 15B. In addition, the second constituent encoder 2840 has a structure which does not generate the tail bits.

Figure 30:
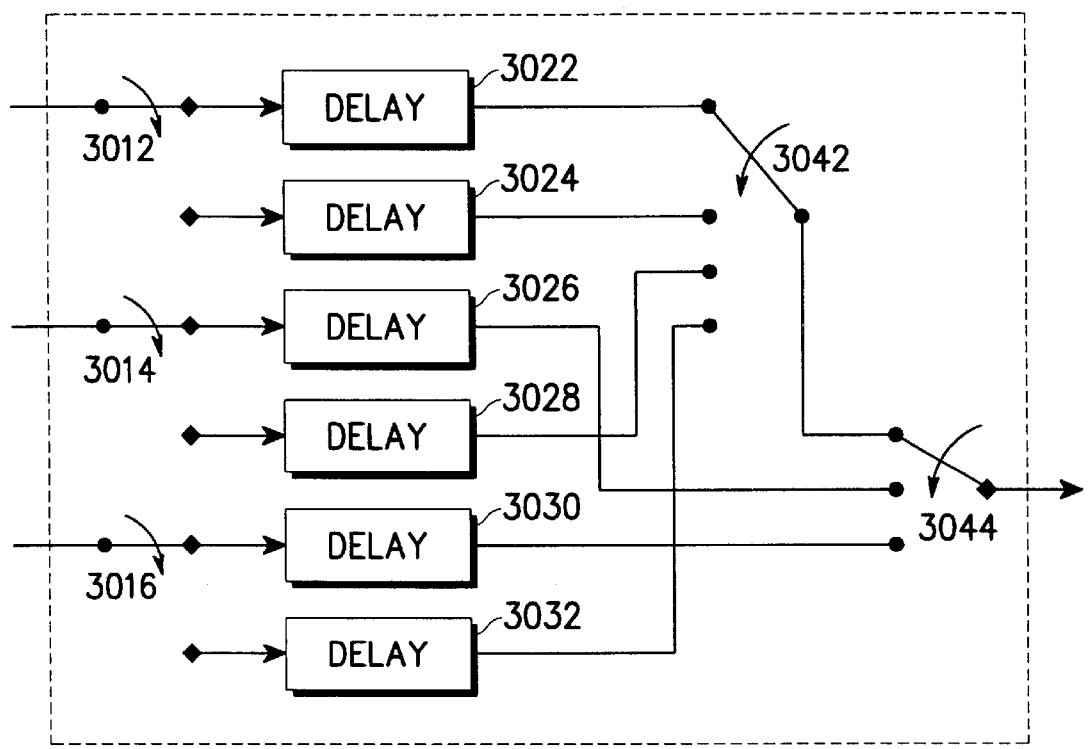
FIG. 30 is a detailed diagram illustrating a multiplexer (2850) of FIG. 28.

FIG. 30 is a diagram illustrating the multiplexer 2850. Referring to FIG. 30, the multiplexer 2850 first receives the 22 data bits $I_k$ output from the bit inserter 2810. A delay 3022 in the multiplexer 2850 then stores the received 22 data bits $I_k$.

Thereafter, the multiplexer 2850 receives the 26 first parity bits $C_k$ output from the first constituent encoder 2820, stores only the first 24 bits in a delay 3026 and stores the remaining 2 bits in a delay 3028 when a switch 3014 is switched to the delay 3028. The multiplexer 2850 receives 4 tail bits $T_k$, stores the first two tail bits in a delay 3022 and the last two tail bits in a delay 3024 when a switch 3012 is switched to the delay 3024. Next, the multiplexer 2850 receives the 26 second parity bits $D_k$, stores the first 24 bits in a delay 3030 and stores the last 2 bits in a delay 3032 when a switch 3016 is switched to the delay 3032.

The delays 1222–1228 each are composed of cascaded memory elements and store the corresponding input bits until the above delay process is completed.

After the above delay process, a switch 3042 is connected to a switch 3044, and the switch 3042 is connected to the delay 3022. Thus, an output of the delay 3022 is output via the switches 3042 and 3044. When one insert bit stored in the delay 3022 is output, the switch 3042 is connected to the delay 3024, maintaining connection with the switch 3044.

Then, one of the last two tail bits stored in the delay 3024 is output via the switches 3042 and 3044. That is, the data bit stored in the delay 3022 is punctured and then, the tail bit stored in the delay 3024 is inserted in the punctured position. Thereafter, the switch 3042 is connected again to the delay 3022, maintaining connection with the switch 3044. The above operation is repeated 2 times to puncture the data bits stored in the delay 3022 and insert in the punctured positions the last 2 tail bits stored in the delay 3024.

Thereafter, the switch 3042 is connected to the delay 3022, maintaining connection with the switch 3044. Then, the output of the delay 3022 is output via the switches 3042 and 3044. When one insert bit stored in the delay 3022 is output, the switch 3042 is connected to the delay 3028, maintaining connection with the switch 3044. Then, one of the remaining 2 first parity bits stored in the delay 3026 is output via the switches 3042 and 3044. Thereafter, the switch 3042 is connected again to the delay 3022, maintaining connection with the switch 3044. The above operation is repeated 2 times to puncture the data bits stored in the delay 3022 and insert in the punctured positions the remaining 2 first parity bits stored in the delay 3028.

Thereafter, the switch 3042 is connected to the delay 3022, maintaining connection with the switch 3044. Then, the output of the delay 3022 is output via the switches 3042 and 3044. When one insert bit stored in the delay 3022 is output, the switch 3042 is connected to the delay 3032, maintaining connection with the switch 3044. Then, one of the remaining 2 second parity bits stored in the delay 3032 is output via the switches 3042 and 3044. Thereafter, the switch 3042 is connected again to the delay 3022, maintaining connection with the switch 3044. The above operation is repeated 2 times to puncture the data bits stored in the delay 3022 and insert in the punctured positions the remaining 2 second parity bits stored in the delay 3032.

Although the present invention has been describing on the assumption that the insert bits are zero bits, it is also possible to use encoded bits or data bits predetermined with a receiver.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A channel encoding device comprising:
   an inserter for inserting at least one predefined bit in an input data bit stream at a predetermined position known by a receiver to form a bit-inserted data;
   a first constituent encoder for encoding output of the inserter to generate a first parity symbol stream;
   an interleaver for interleaving output of the inserter; and
   a second constituent encoder for encoding an output of the interleaver to generate a second parity symbol stream.

2. The channel encoding device as claimed in claim 1, wherein each of the first and second constituent encoders is a recursive systemic channel encoder.

3. The channel encoding device as claimed in claim 1, wherein the predefined bit insert positions are distributed at a rear portion of the data bit stream being input to the respective constituent encoders.

4. A channel encoding device comprising:
   an inserter for inserting at least one predefined bit in an input data bit stream at a predetermined position known by a receiver to form a bit-inserted data;
   a first constituent encoder for encoding output of the inserter to generate a first parity symbol stream;
   an interleaver for interleaving output of the inserter;
   a second constituent encoder for encoding an output of the interleaver to generate a second parity symbol stream; and
   a selector for selecting an output of the bit inserter and an output of the constituent encoders and outputting the selected output as a channel encoded symbol stream.

5. The channel encoding device as claimed in claim 4, wherein each of the first and second constituent encoders is a recursive systemic channel encoder.

6. The channel encoding device as claimed in claim 4, wherein the predefined bit insert positions are distributed at a rear portion of the data bit stream being input to the respective constituent encoders.

7. The channel encoding device as claimed in claim 6, wherein the predefined bits are zero bits.

8. A channel encoding device comprising:
   a bit inserter for inserting at least one predefined bit in an input data bit stream at a predetermined position known by a receiver to form a bit-inserted data;
   a first constituent encoder for encoding output of the inserter to generate a first parity symbol stream;
   an interleaver for interleaving output of the inserter;
   a second constituent encoder for encoding an output of the interleaver to generate a second parity symbol stream; and
   a multiplexer for puncturing bits inserted in the predefined positions from the bit inserted data and inserting the encoded symbols in the punctured positions as many as the number of the punctured bits, to output channel encoded data.

9. The channel encoding device as claimed in claim 8, wherein the predefined bit insert positions are distributed at a rear portion of the data bit stream being input to the respective constituent encoders.

10. A channel encoding device comprising:
    an inserter for inserting at least one predefined bit in an input data bit stream at a predetermined position known by a receiver to form a bit-inserted data;
    a first constituent encoder for encoding output of the inserter to generate a first parity symbol stream;
    an interleaver for interleaving output of the inserter;
    a second constituent encoder for encoding an output of the interleaver to generate a second parity symbol stream; and
    a selector for puncturing known bits inserted in the predefined positions from the bit-inserted data bit stream output from the bit inserter, and repeatedly inserting a part of the encoded symbol stream in the punctured bit positions, to output channel encoded data.

11. The channel encoding device as claimed in claim 10, wherein the selector is a multiplexer which punctures known bits inserted in the predefined positions from the bit-inserted data bit stream output from the bit inserter, and repeatedly inserting the first and second symbols as many as the number of the punctured bits, so as to output the data bit stream in an input frame size, the first parity symbol stream and the second parity symbol stream, as channel encoded data.

12. The channel encoding device as claimed in claim 11, wherein the first and second parity symbols inserted in the punctured positions by the multiplexer include a predetermined number of symbols distributed at the last portions of the first and second parity symbol streams.

13. A channel encoding method comprising the steps of:
   inserting at least one predefined bit in an input data bit stream at a predetermined position known by a receiver to generate a bit-inserted data bit stream;
   encoding the bit-inserted data bit stream to generate a first parity symbol stream;
   interleaving the bit-inserted data bit stream; and
   encoding the interleaved bit-inserted data bit stream to generate a second parity symbol stream.

14. The channel encoding method as claimed in claim 13, wherein the encoding is performed by RSC (recursive systemic channel) encoding.

15. The channel encoding method as claimed in claim 13, wherein the predefined bit insert positions are distributed at a rear portion of the data bit stream being input in the encoding step.

16. A channel encoding method comprising the steps of:
   inserting at least one predefined bit in an input data bit stream at a predetermined position known by a receiver to generate a bit-inserted data bit stream;
   encoding the bit-inserted data bit stream to generate a first parity symbol stream;
   interleaving the bit-inserted data bit stream;
   encoding the interleaved bit-inserted data bit stream to generate a second parity symbol stream; and
   sequentially selecting the bit-inserted data bit stream, the parity symbol stream and the second parity symbol stream, and outputting the selected values as a channel encoded symbol stream.

17. The channel encoding method as claimed in claim 16, wherein encoding is performed by RSC (recursive systemic channel) encoding.

18. The channel encoding method as claimed in claim 16, wherein the predefined bit insert positions are distributed at a rear portion of the data bit stream being input in the encoding step.

19. The channel encoding method as claimed in claim 18, wherein the predefined bits are zero bits.

20. A channel encoding method comprising the steps of:
   inserting at least one predefined bit in an input data bit stream at a predetermined position known by a receiver to generate a bit-inserted data bit stream;
   encoding the bit-inserted data bit stream to generate a first parity symbol stream;
   interleaving the bit-inserted data bit stream;
   encoding the interleaved bit-inserted data bit steam to generate a second parity symbol stream; and
   outputting a channel encoded symbol stream by puncturing bits inserted in the predefined positions from the bit-inserted data bit stream and inserting a parts of the first and second parity symbol stream in the punctured positions as many as the number of the punctured bits.

21. The channel encoding method as claimed in claim 20, further comprising a outputting step of puncturing the inserted predefined bits and inserting the parity symbols in the data bit stream at the punctured bit positions as many as the number of the punctured bits, so as to output, as channel encoded data, the data bit stream in an input frame size, the first parity symbols from which the first parity symbols inserted in the punctured positions are excluded, and the second parity symbols from which the second parity symbols inserted in the punctured positions are excluded.

22. The channel encoding method as claimed in claim 21, wherein the predefined bit insert positions are distributed at a rear portion of the data bit stream being input in the encoding steps.

23. A channel encoding method comprising the steps of:
   inserting at least one predefined bit in an input data bit stream at a predetermined position known by a receiver to generate a bit-inserted data bit stream;
   generating tail bits for termination and encoding the bit-inserted data bit stream and the tail bits to generate a first parity symbol stream;
   interleaving the bit-inserted data bit stream;
   generating tail bits for termination and encoding the interleaved bit-inserted data bit stream and the tail bits to generate a second parity symbol stream; and
   outputting a channel encoded symbol stream by puncturing bits inserted in the predefined positions from the data bit stream output from the bit inserter and inserting the parity symbols for the tail bits in the punctured positions.

24. The channel encoding method as claimed in claim 23, further comprising a outputting step of puncturing the inserted predefined bits and inserting the parity symbols in the data bit stream at the punctured bit positions as many as the number of the punctured bits, so as to output, as channel encoded data, the data bit stream in an input frame size, the first parity symbols from which the first parity symbols inserted in the punctured positions are excluded, and the second parity symbols from which the second parity symbols inserted in the punctured positions are excluded.

25. A channel encoding method comprising the steps of:
   inserting at least one predefined bit in an input data bit stream at a predetermined position known by a receiver to generate a bit-inserted data bit stream;
   encoding the bit-inserted data bit stream output from the bit inserter to generate a first parity symbol stream;
   interleaving the bit-inserted data bit stream;
   encoding the interleaved bit-inserted data bit stream to generate a second parity symbol stream; and
   outputting a channel encoded symbol stream by puncturing known bits inserted in the predefined positions from the data bit stream output from the bit inserter, and repeatedly inserting a part of the encoded symbol stream in the punctured bit position, to output channel encoded data.

26. The channel encoding method as claimed in claim 25, further comprising a outputting step of puncturing known bits inserted in the predefined positions from the bit-inserted data bit stream output from the bit inserter and repeatedly inserting the first and second symbols as many as the number of the punctured bits, so as to output the data bit stream in an input frame size, the first parity symbol stream and the second parity symbol stream, as channel encoded data.

27. The channel encoding method as claimed in claim 26, wherein the first and second symbols inserted in the punctured positions in the outputting step include a predetermined number of symbols distributed at the last portions of the first and second parity symbol streams.

* * * * *